(12) United States Patent
Schloesser

(10) Patent No.: US 7,034,408 B1
(45) Date of Patent: Apr. 25, 2006

(54) MEMORY DEVICE AND METHOD OF MANUFACTURING A MEMORY DEVICE

(75) Inventor: Till Schloesser, Dresden (DE)

(73) Assignee: Infineon Technologies, AG, Munich (DE)

( * ) Notice: Subject to any disclaimer, the term of this patent is extended or adjusted under 35 U.S.C. 154(b) by 0 days.

(21) Appl. No.: 11/005,045

(22) Filed: Dec. 7, 2004

(51) Int. Cl.
*H01L 27/108* (2006.01)

(52) U.S. Cl. .................. 257/905; 257/903; 257/906; 257/908; 365/149

(58) Field of Classification Search ............ 257/301, 257/302, 303, 329, 905, 903, 906, 907, 908; 365/63, 149
See application file for complete search history.

(56) References Cited

U.S. PATENT DOCUMENTS

| | | | |
|---|---|---|---|
| 5,502,320 A | 3/1996 | Yamada | |
| 6,191,975 B1 * | 2/2001 | Shimizu et al. | 365/185.17 |
| 6,419,948 B1 | 7/2002 | Blume et al. | |
| 6,545,904 B1 * | 4/2003 | Tran | 365/149 |
| 6,635,918 B1 * | 10/2003 | Narui et al. | 257/311 |
| 6,785,157 B1 * | 8/2004 | Arimoto et al. | 365/149 |

FOREIGN PATENT DOCUMENTS

WO    WO 01/01489 A1    4/2000

* cited by examiner

*Primary Examiner*—Christian D. Wilson
*Assistant Examiner*—Douglas Menz
(74) *Attorney, Agent, or Firm*—Edell, Shapiro & Finnan, LLC

(57) ABSTRACT

A memory device includes a DRAM memory cell array, which is implemented as a 6 F×F array, and peripheral circuitry. The word lines of the memory cell array are implemented as buried word lines, and, in addition, the bit lines including the bit line contacts are made of a bit line layer stack. The peripheral circuitry includes a peripheral transistor including first and second source/drain regions, a channel connecting the first and the second source/drain regions as well as a peripheral gate electrode for controlling an electrical current of the channel. The peripheral gate electrode is made of a peripheral gate stack including a layer stack which is identical with the bit line stack.

18 Claims, 24 Drawing Sheets

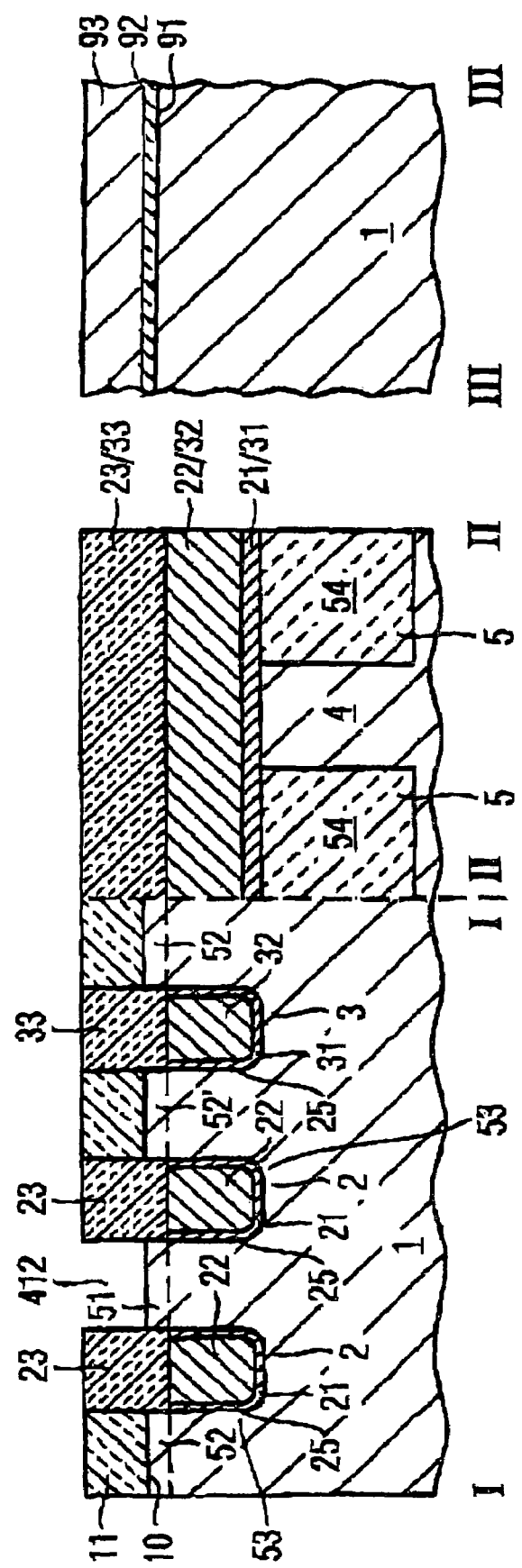

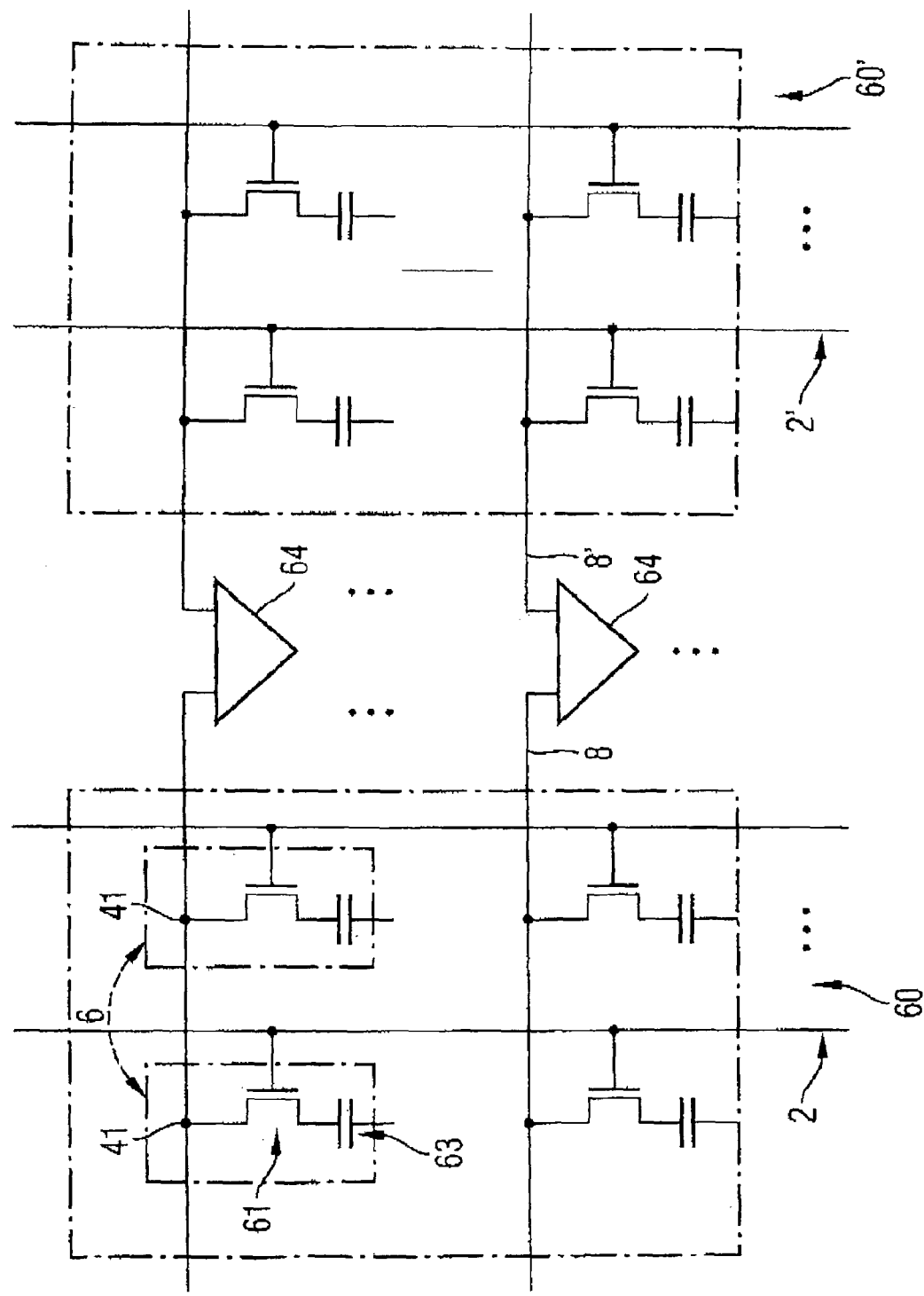

US 7,034,408 B1

MEMORY DEVICE AND METHOD OF MANUFACTURING A MEMORY DEVICE

FIELD OF THE INVENTION

The invention relates to a memory device comprising a plurality of memory cells of a DRAM (Dynamic Random Access) memory as well as to a method of manufacturing such a memory device.

BACKGROUND

Memory cells of a dynamic random access memory (DRAM) generally comprise a storage capacitor for storing an electrical charge which represents an information to be stored, and an access transistor which is connected with the storage capacitor. The access transistor comprises a first and a second source/drain regions, a channel connecting the first and the second source/drain regions as well as a gate electrode controlling an electrical current flow between the first and second source/drain regions. The transistor usually is at least partially formed in the semiconductor substrate. The gate electrode forms part of a word line and is electrically isolated from the channel by a gate dielectric. By addressing the access transistor via the corresponding word line, the information stored in the storage capacitor is read out. In particular, the information is read out to a corresponding bit line via a bit line contact.

In the currently used DRAM memory cells, the storage capacitor can be implemented as a trench capacitor in which the two capacitor electrodes are disposed in a trench which extends in the substrate in a direction perpendicular to the substrate surface.

According to another implementation of the DRAM memory cell, the electrical charge is stored in a stacked capacitor, which is formed above the surface of the substrate.

A memory device further comprises a peripheral portion. Generally, the peripheral portion of the memory device includes circuitry for addressing memory cells and for sensing and processing the signals received from the individual memory cells. Usually, the peripheral portion is formed in the same semiconductor substrate as the individual memory cells. Hence, it is highly desirable to have a manufacturing process by which the components of the memory cell array and the peripheral portion can be formed simultaneously.

Generally, a DRAM memory cell array is desired that includes a higher packaging density which can be produced by a simple, robust process having a low complexity and a high yield.

For example, U.S. Pat. No. 6,545,904 discloses a memory cell including an access transistor and a storage capacitor, which can be formed so as to implement a 6 $F^2$ (6 F×F) DRAM array, wherein F denotes the minimum pitch according to the technology used. In particular, two neighbouring access transistors are arranged, so that they have one common bit line contact. In addition, neighbouring access transistors formed on a single active area line are electrically isolated from each other by an isolation gate line.

In addition, U.S. Pat. No. 6,419,948 discloses a memory cell array in which the active area is formed as a continuous line. The active area line and the bit line are formed as weaving lines, so that, when looked at in a plan view, one bit line and one corresponding active area line intersect at many points. According to this layout, the memory cells can have an area of about 6 $F^2$.

DE 199 28 781 discloses a 6 $F^2$ memory cell in which two adjacent memory cells share one common bit line contact. Two neighbouring pairs of memory cells which are assigned to one active area line are separated and electrically isolated from each other by a groove which is filled with an isolating material.

Furthermore, U.S. Pat. No. 5,502,320 discloses a memory cell array in which transistors are formed in continuous active area lines. The active area lines are arranged in parallel with the bit lines. Two adjacent pairs of neighbouring memory cells are separated and isolated from each other by applying an appropriate voltage to isolation gate lines which are arranged between the two adjacent pairs of memory cells. The word lines and the isolation gate lines are implemented as buried word lines and buried isolation gate lines, respectively.

SUMMARY OF THE INVENTION

In one embodiment of the invention, a memory device comprises memory cells, the memory cells being at least partially formed in a semiconductor substrate having a surface, bit lines extending in a first direction along the substrate, gate grooves extending in a second direction along the substrate, the second direction intersecting the first direction, the gate grooves being formed in the semiconductor substrate surface and including word lines disposed in the gate grooves, and peripheral circuitry. The peripheral circuitry comprises at least one peripheral transistor, the peripheral transistor comprising first and second peripheral source/drain regions, a peripheral channel connecting the first and second peripheral source/drain regions and a peripheral gate electrode controlling the conductivity of the peripheral channel, the peripheral gate electrode being formed of a peripheral gate stack comprising at least one layer, the peripheral circuitry being connected with the word lines and the bit lines. Each of the memory cells comprises an access transistor comprising first and second source/drain regions, a channel disposed between the first and second source/drain regions and a gate electrode that is electrically isolated from the channel and adapted to control the conductivity of the channel. The gate electrode of the access transistor forms part of the word lines and the word lines include a top surface disposed beneath the substrate surface. The access transistor is at least partially formed in the semiconductor substrate, and the first source/drain region is connected with a corresponding one of the bit lines via a bit line contact. The device further comprises storage elements for storing information, the storage elements being adapted to be accessed by the access transistor, and the bit lines including the bit line contacts of the device are made of a bit line stack comprising at least one layer that is identical to the peripheral gate stack.

In another embodiment of the present invention, a method of manufacturing a memory device comprises: forming memory cells by providing access transistors, each of the access transistors comprising first and a second source/drain regions, a channel disposed between the first and second source/drain regions and a gate electrode that is electrically isolated from the channel and adapted to control the conductivity of the channel, the access transistors being at least partially formed in a semiconductor substrate including a surface, and by providing storage elements for storing information, each of the storage elements being adapted to be accessed by one of the access transistors; providing bit lines extending in a first direction along the substrate, the bit lines being connected with the first source/drain regions of the access transistors via bit line contacts; providing word lines extending in a second direction along the substrate, the second direction intersecting the first direction; and providing peripheral circuitry, the peripheral circuitry comprising at least one peripheral transistor, the peripheral transistor comprising a first and a second peripheral source/drain regions, a peripheral channel connecting the first and second peripheral source/drain regions and a peripheral gate electrode controlling the conductivity of the peripheral channel, the gate electrode of the access transistor forming part of one of the word lines, the peripheral circuitry being connected with the word lines and the bit lines, wherein a top surface of the word line is disposed beneath the substrate surface, and the peripheral gate electrodes and the bit lines including the bit line contacts are made by forming a layer stack comprising at least one layer on the substrate surface so as to cover the memory cells and the peripheral circuitry, and, subsequently patterning the layer stack so as to form the bit lines and the peripheral gate electrodes.

The above and still further objects, features and advantages of the present invention will become apparent upon consideration of the following detailed description of specific embodiments thereof, wherein like numerals designate like components in the drawings.

BRIEF DESCRIPTION OF THE DRAWINGS

FIG. 17 shows a schematic circuit representing a memory cell array of the present invention.

DETAILED DESCRIPTION

In the following detailed description, reference is made to the accompanying drawings, which form a part hereof, and in which are illustrated by way of illustration specific embodiments in which the invention may be practiced. In this regard, directional terminology such as "top", "bottom", "front", "back", "leading", "trailing", etc., is used with reference to the orientation of the Figures being described. Because components of embodiments of the present invention can be positioned in a number of different orientations, the directional terminology is used for purposes of illustration and in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 13A:
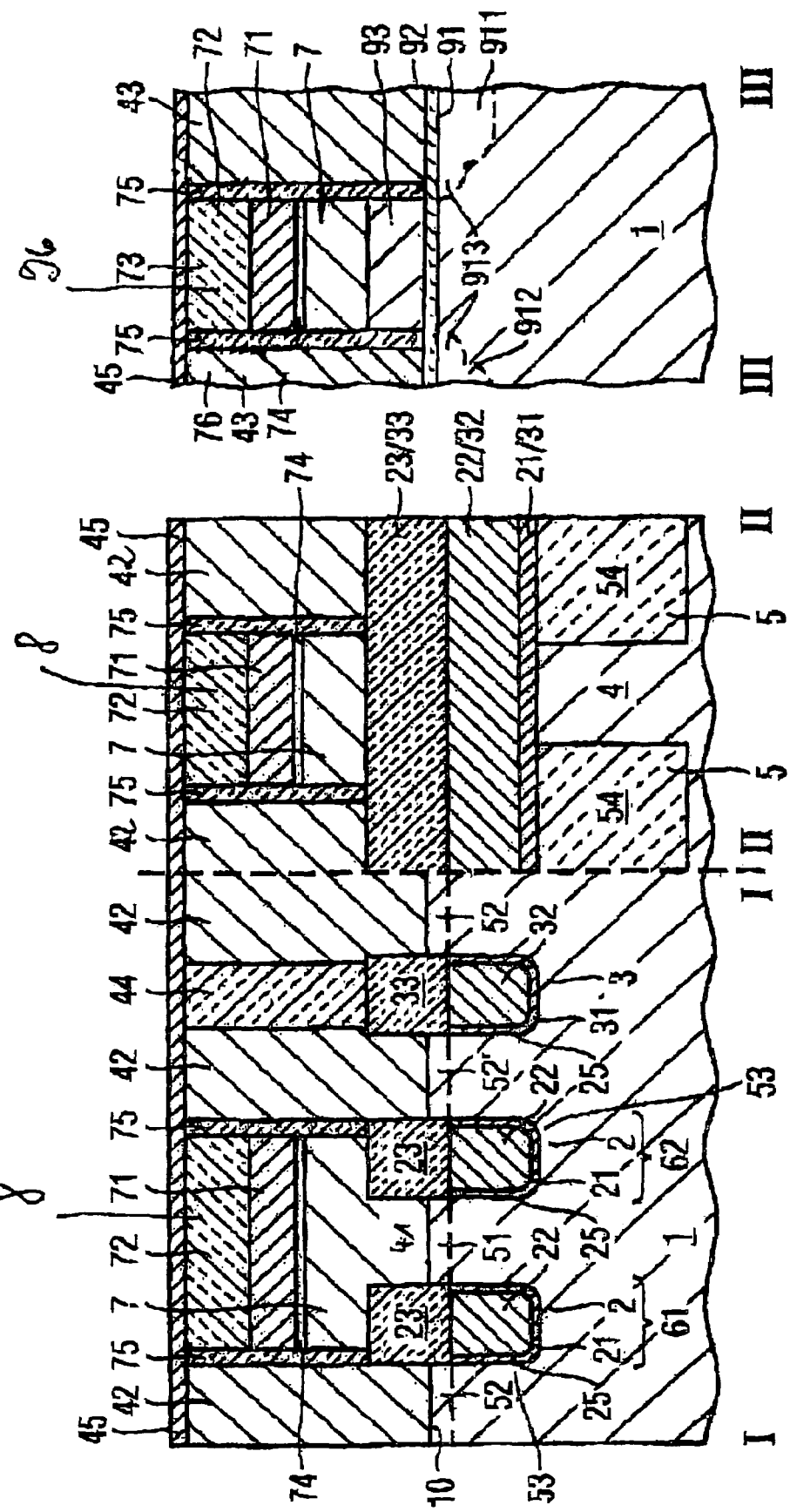
FIGS. 13A and 13B illustrate a cross-section and a plan view, respectively, of the memory cell array of the present invention after completing the access transistor.
Figure 15:
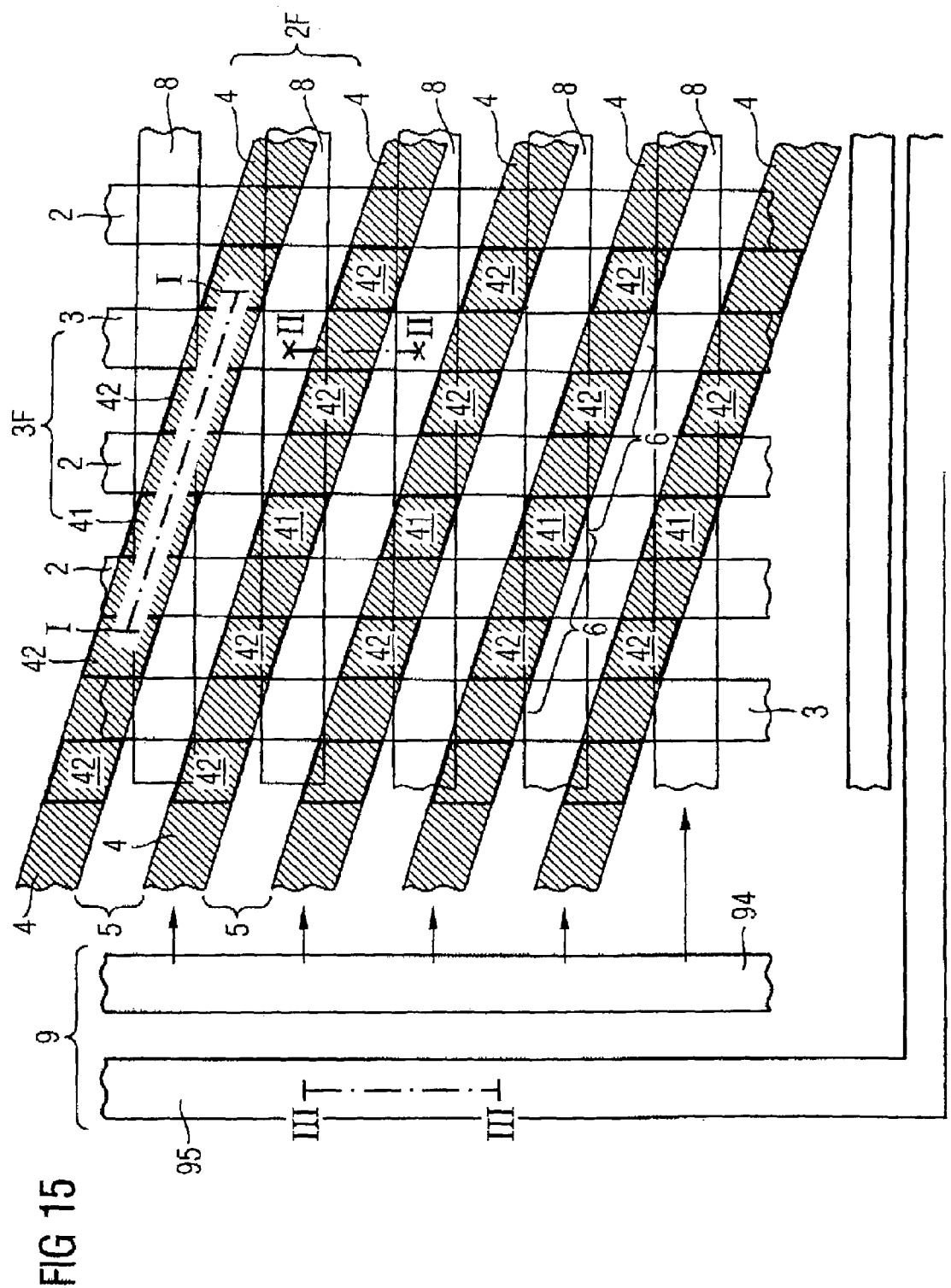
FIG. 15 shows a preferred layout of the memory cell array of the present invention.

FIG. 13A shows a cross-section of an embodiment of the memory cell array of the present invention after completing the access transistor. The left hand portion of FIG. 13A is taken between I and I as shown in FIG. 15, the middle portion of the cross-section is taken between II and II, whereas the right hand side of FIG. 13A illustrates the cross-section between III and III, as shown in FIG. 15. In particular, the cross-section between I and I shows a cross-section along the active area line, whereas the cross-section between II and II shows a cross-section perpendicular to a bit line 8 beneath an isolation gate line, and the cross-section between III and III shows a cross-section of the peripheral portion 9 of the memory device. As is to be noted, according to the present embodiment, the cross-section between II and II could as well be taken from a portion beneath a word line because, as will be pointed out later, the word lines and the isolation gate lines preferably have an identical construction and an identical cross-section. Accordingly, in the cross-section between II and II, the layers are denoted by 21, 22, 23, and, likewise, by 31, 32, 33, so as to show that the layer stack can be the that of the word line or that of the isolation gate line.

In FIG. 13A the storage element such as a storage capacitor is omitted. An exemplary construction thereof can be seen from FIG. 14A.

In a cross-section along an active area line, a first and a second access transistors 61, 62 are disposed adjacent to each other. The first access transistor 61 comprises a first source/drain region 51 and a second source/drain region 52, which are both implemented as n-doped portions, for example. The channel 53 or channel region is formed in the p-doped substrate portion between the first and the second source/drain regions 51, 52, and the conductivity of the channel is controlled by applying an appropriate voltage to the word line 2. The word line 2 comprises a gate dielectric 21 for isolating the word line 2 from the channel 53 and additionally comprises a high conductivity layer 22 such as a metallic layer. In particular, the metallic layer can be made from titan nitride, tungsten or other metals as commonly used in the art.

Nevertheless, any other suitable conducting material such as polysilicon can be used as well. Preferably, an insulating layer 23 is disposed above the high conductivity layer 22 so as to electrically isolate the word line from the substrate. The second access transistor 62 likewise comprises a first and a second source/drain regions 51, 52' as well as a channel 53 in the p-doped substrate portion between the first and the second source/drain regions. The conductivity of the channel 53 is controlled by the word line 2 having an identical construction to the word line of the first access transistor.

On the right hand portion of the second source/drain region 52' an isolation gate line 3 is disposed. The isolation gate line 3 comprises a gate dielectric 31 as well as a high conductivity layer 32. An insulating layer 33 is disposed above the high conductivity layer 32 so as to accomplish an electric isolation from the substrate and, in particular the adjacent second source/drain regions 52, 52'. An appropriate voltage is usually applied to the isolation gate line 3 so as to prevent an electrical current from flowing between the second source/drain region 52' and the second source/drain region 52 of the access transistor disposed on the right hand side of the second access transistor 62.

Nevertheless, any other isolation device, for example, an isolation groove filled with an insulating material could be as well used so as to electrically isolate adjacent memory cells from each other.

A node contact 42 connects the second source/drain regions 52, 52' with the storage electrode of a storage capacitor (not shown). In addition, the two access transistors 61, 62 have a common bit line contact 41.

The word lines 2 and isolation gate lines 3 are implemented as buried word lines. Stated more concretely, the top surfaces of the conducting portion of the word line 2 and the isolation gate line 3 are disposed beneath the substrate surface 10. As is shown in FIG. 13A, the second source/drain regions 52, 52' extend to a depth which is approximately equal to the depth of the insulating layer 23. Accordingly, the second source/drain regions 52, 52' which will later be connected with the storage capacitor, are shielded from the gate electrode by this insulating layer 23. In other words, by providing a gate groove in which a word line is disposed, the distance between the gate electrode and the second source/drain region can be increased. By additionally providing an insulating layer, the gate electrode can be isolated from the source/drain regions very effectively. As a consequence, the electric field at the node junction, i.e. the second source/drain region which is to be connected with the storage capacitor, will be reduced. Hence, the retention time of the memory cell i.e. the time during which information is recognizably stored in the memory cell, can be increased.

In FIG. 13A, the gate groove extends to a depth of approximately 60 to 80 nm below the substrate surface, the thickness of the high conductivity layer is 40 to 60 nm, and the thickness of the insulating layers 23, 33 is about 60 to 80 nm. According to a preferred embodiment, the insulating layer 23, 33 is partly buried, the insulating layer 23, 33 having a portion projecting from the substrate surface 10. This portion projects from the substrate surface 10 essentially to an extent corresponding to the thickness of the hard mask which is used for patterning the gate grooves 25. The projecting portion of the insulating layers 23, 33 provides an electrical isolation between the word line or isolation gate line and the node contact.

As can be seen from FIG. 13A, the gate grooves 25 extend to a depth that is less than the depth of isolation trenches 5. The gate grooves 25 are formed so as to have rounded corners at the bottom thereof. Stated differently, by employing an isotropical etching step, sharp corners at an intersection of the sidewalls and the bottom face of the gate grooves are rounded. As a consequence, a non-uniform electrical field, which otherwise would occur at these corners, is avoided. As a further consequence, an unwanted decrease of the on-current of the transistor is avoided. Accordingly, the channel 53 connecting first and second source/drain regions 51, 52, essentially has the shape of a "U".

The bit line contact can be made of polysilicon in FIG. 13A. The bit line including the bit line contact can be made of a layer stack comprising a polysilicon layer 7 having a thickness of about 20 to 30 nm, optionally, a barrier layer, made of Ti, TiN or WN, for example, a metallic layer 71 having a thickness of about 40 nm, a silicon nitride layer 72 and a silicon dioxide spacer 73. The material of the metallic layer can be an arbitrary metal as commonly used, in particular W, TiN or a metal silicide as commonly used.

By providing a bit line stack comprising a polysilicon layer and a metal layer, the contact resistance can be remarkably reduced.

As can be seen from the cross-section between III and III on the right hand side of FIG. 13A, a transistor in a peripheral portion comprises a first and a second source/drain regions 911, 912, a silicon dioxide layer 92 as well as a peripheral gate electrode 96 which is made of a layer stack comprising a polysilicon layer 93, a polysilicon layer 7, a high conductivity layer 71 and a silicon nitride layer 72. Additionally, a spacer 75 made of SiO$_2$ is provided. The conductivity of the channel between first and second source/drain regions 911, 912 is controlled by applying an appropriate voltage to the peripheral gate electrode 96.

As can be seen from FIG. 13A, the bit line including the bit line contact of the memory cell array is made of a layer stack which is identical with the upper part of the peripheral gate stack. Accordingly, both layer stacks comprise the same layers, having the same thicknesses and the same succession of layers. Nevertheless, the layer stack of the peripheral gate electrode additionally comprises a polysilicon layer 93 which is disposed beneath this upper part of the peripheral gate stack.

In other words, the bit line including the bit line contact of the memory cell array and the gate electrode of the peripheral portion of the memory device are made from the same layer stack. Accordingly, they can be manufactured by the same processing steps. Nevertheless, it is possible to form additional layers in the peripheral portion and/or the memory cell array before forming the gate stack.

Furthermore, since the word lines 2 are formed as buried word lines, the capacity between bit line and word line can be reduced, whereby a signal-noise ratio can be improved.

The method of the present invention is advantageous, because only lithographic steps with masks having a lines/spaces pattern are performed before patterning the stacked capacitor. Moreover, for manufacturing the memory cell array of the present invention, etching steps for etching self-aligned contacts with a high aspect ratio, i.e. a high ratio of depth to width, by etching silicon oxide selectively with respect to silicon nitride can be avoided.

Moreover, bit line contacts having large contact areas can be formed. Thereby, the contact resistance can be largely reduced. Additionally, only lithographic steps with masks having a lines/spaces pattern are performed. In summary, the present invention provides a memory cell array which surprisingly can be manufactured by a simple, robust process. As a consequence, the cost can be reduced and, at the same time, the yield can be increased.

FIGS. 1 to 12 illustrate the method of forming the memory cell array as shown in FIG. 13A.

Figure 1A:
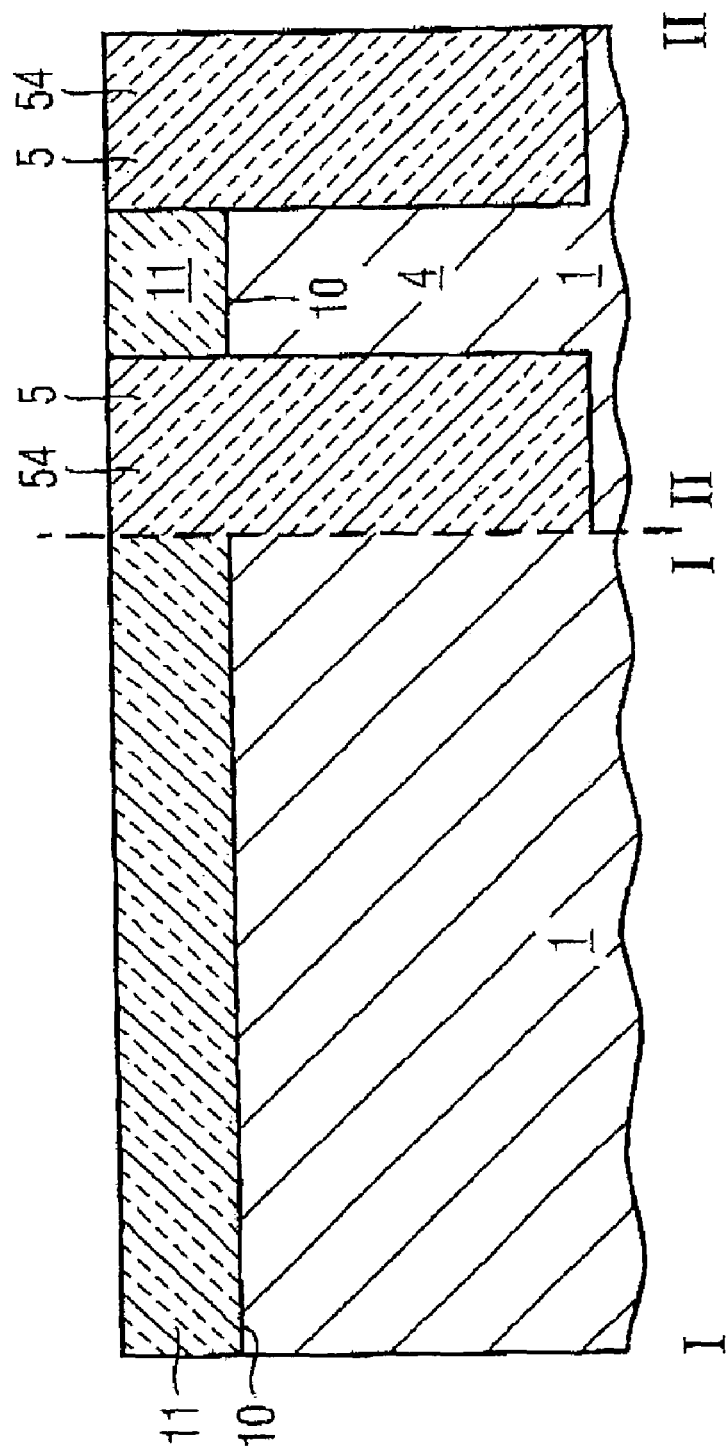
FIGS. 1 to 12 illustrate one embodiment of the method of manufacturing a memory cell array of the present invention.
Figure 1B:
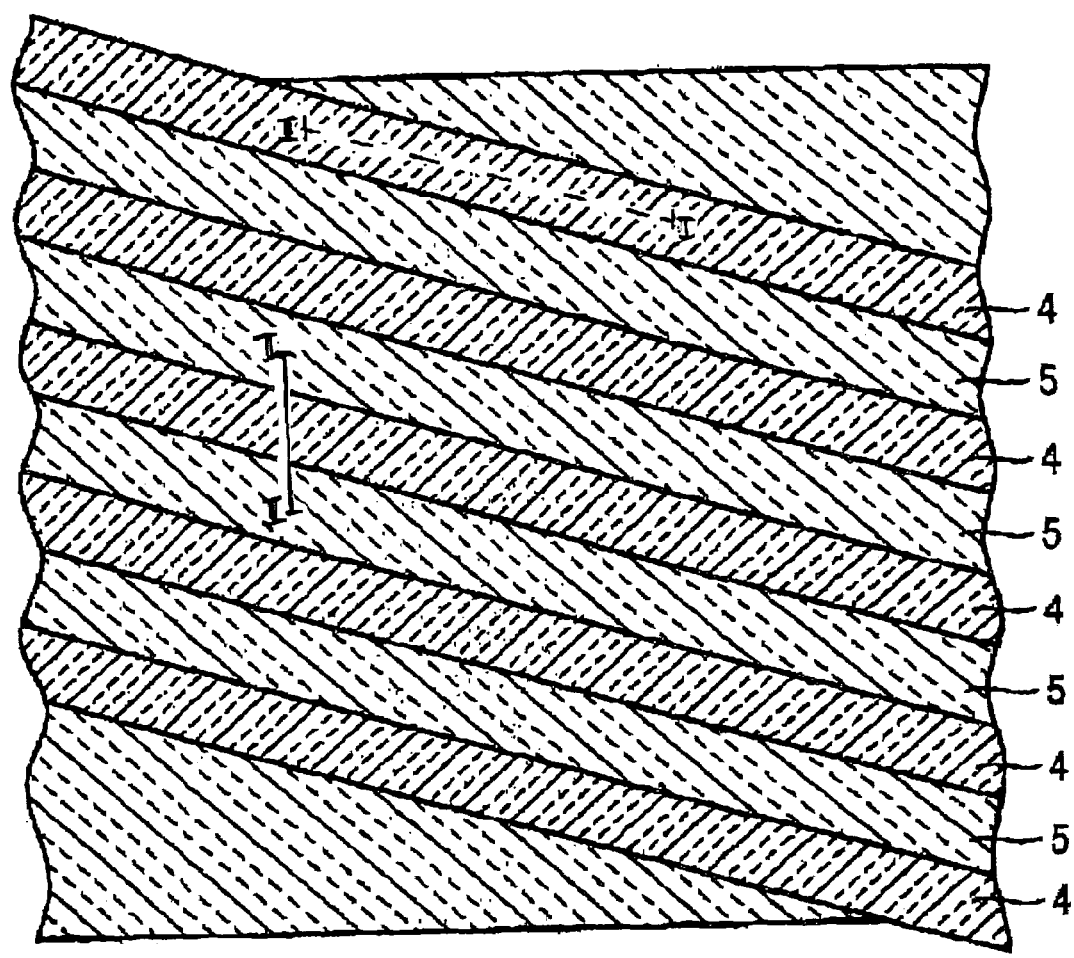

The following cross-sections are taken between I and I and II and II, respectively, as can be seen, for example, from FIG. 1B. To be more specific, the cross-section between I and I is taken along an active area line 4 so as to intersect two word lines 2 and one isolation gate line 3. Moreover, the cross-section between II and II is taken perpendicularly to a bit line 8 so as to intersect a first isolation trench 5, an active area line 4, and a second isolation trench 5.

In FIG. 1A, the left hand side shows the cross-section along an active area between I and I as can for example be seen from FIG. 1B, whereas the right hand side of FIG. 1A shows a cross-section perpendicular to the bit lines 8 under an isolation gate line, between II and II, in the plan view of the memory cell array shown in FIG. 1B.

On the surface 10 of a semiconductor substrate 1, such as a silicon substrate, in particular, a p-doped silicon substrate, first, a pad oxide layer made of silicon dioxide (not shown) is deposited. Thereafter, first the well portions, then, the usual LDD (lightly doped drain) portions which are advantageously disposed beneath the source/drain portions and, optionally, the first and second source/drain regions are doped by ion implantation. Thereafter a pad silicon nitride layer 11 having a thickness of about 50 to 70 nm is deposited by generally known methods. The pad silicon nitride layer 11 as well as the previously deposited pad oxide layer act as a hardmask layer stack. As is to be noted, the hardmask layer stack may comprise one or more layers. Accordingly, the term "hardmask layer stack" as used herein encompasses one ore more layers. In particular, the hardmask layer stack comprises at least one layer which is different from the layer to be patterned. In particular, if the hard mask layer stack comprises only one layer, this layer has to be different from the material to be patterned.

Then, the active area lines 4 are photolithographically defined by patterning isolation trenches 5 as is generally known in the art.

The isolation trenches 5 usually have a depth of approximately 250 nm and a distance of 1F. Accordingly, active area lines having a width of about 1F are defined, as can be seen from the cross-section between II and II. As has been mentioned above, F denotes the minimum pitch accordingly to the technology used. For example, a minimum pitch of 90 nm, 60 nm, 50 nm or even less is desired.

After etching the isolation trenches 5, a thermal oxidation step for providing a silicon dioxide layer (not shown) is performed, optionally, a thin silicon nitride layer (not shown) is deposited, followed by a silicon dioxide layer 54. Finally, the isolation trenches are completely filled with an isolating material. Then, a planarizing step is performed, thereby obtaining the structure shown in FIG. 1A.

FIG. 1B shows a plan view on the resulting memory cell array. As can be seen, active area lines 4 are formed as continuous lines extending in parallel to each other. The active area lines 4 are separated and electrically isolated from each other by the isolation trenches 5.

Figure 2:
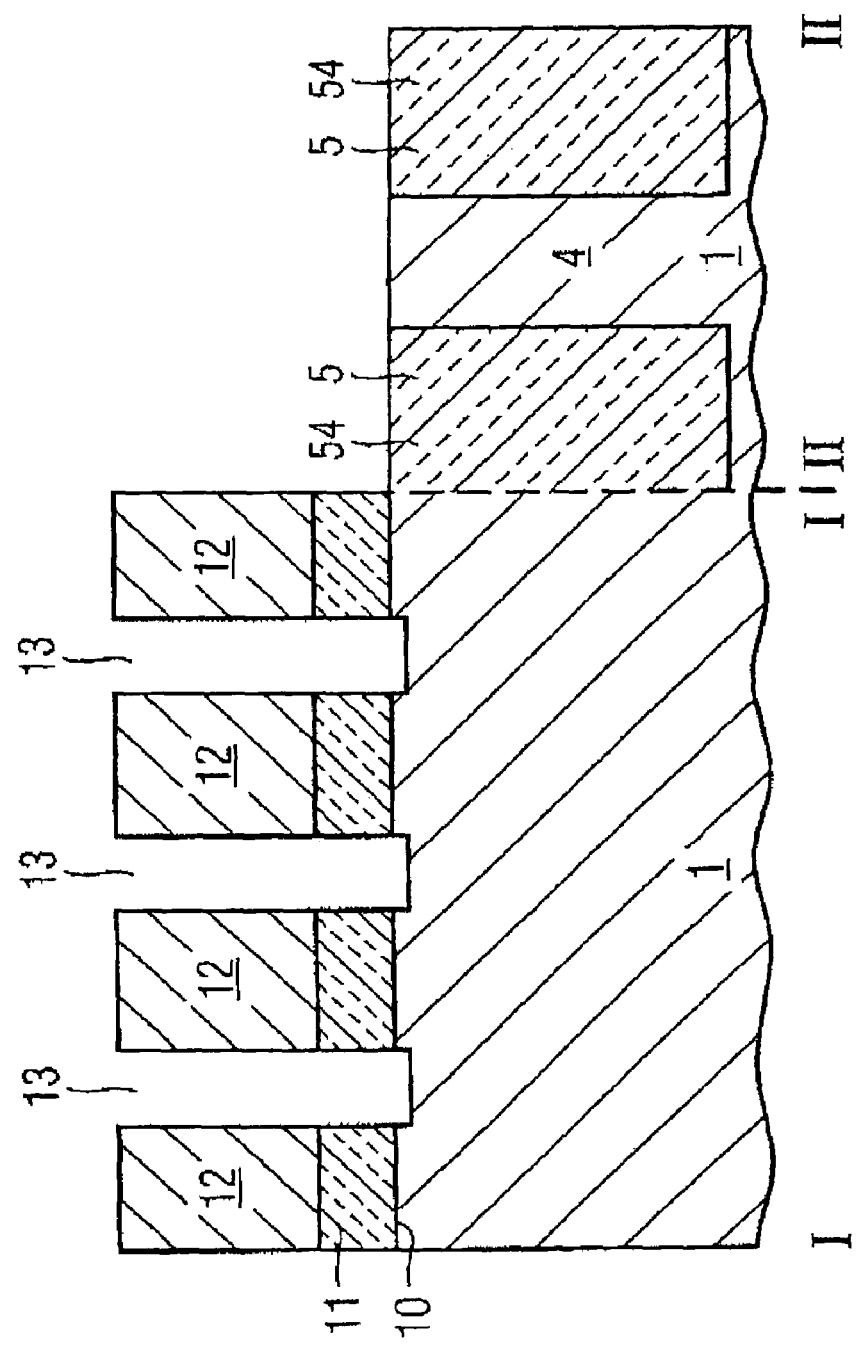

In the next steps, the gate grooves 25 for forming the word lines and the isolation gate lines are photolithographically defined. To this end, first, a groove hard mask layer 12 made of polysilicon or carbon, for example, is deposited at a thickness of about 700 nm. Thereafter, using a mask having a stripe pattern, openings 13 in the hard mask layer and in the silicon nitride layer 11 are photolithographically defined and etched. The width of the openings 13 is smaller than F. The resulting structure is shown in FIG. 2.

Figure 3:
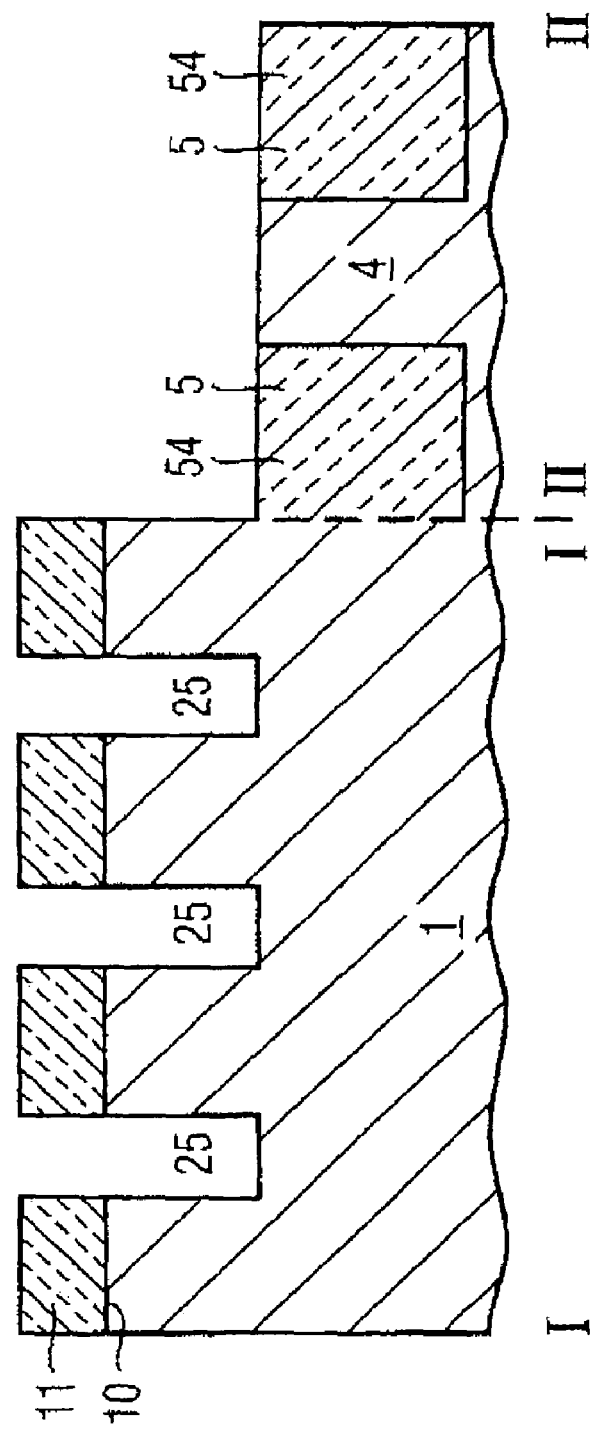

Thereafter, an non-selective etching step is performed so as to define gate grooves 25 in the semiconductor substrate 1. Since this etching step is non-selective, in the cross-section between II and II also the isolation trenches 5 are etched. The grooves 25 now have a width of 0.5F to 0.7 F. Thereafter, the hard mask layer 12 is stripped by generally known methods. The resulting structure is shown in FIG. 3.

Figure 4A:
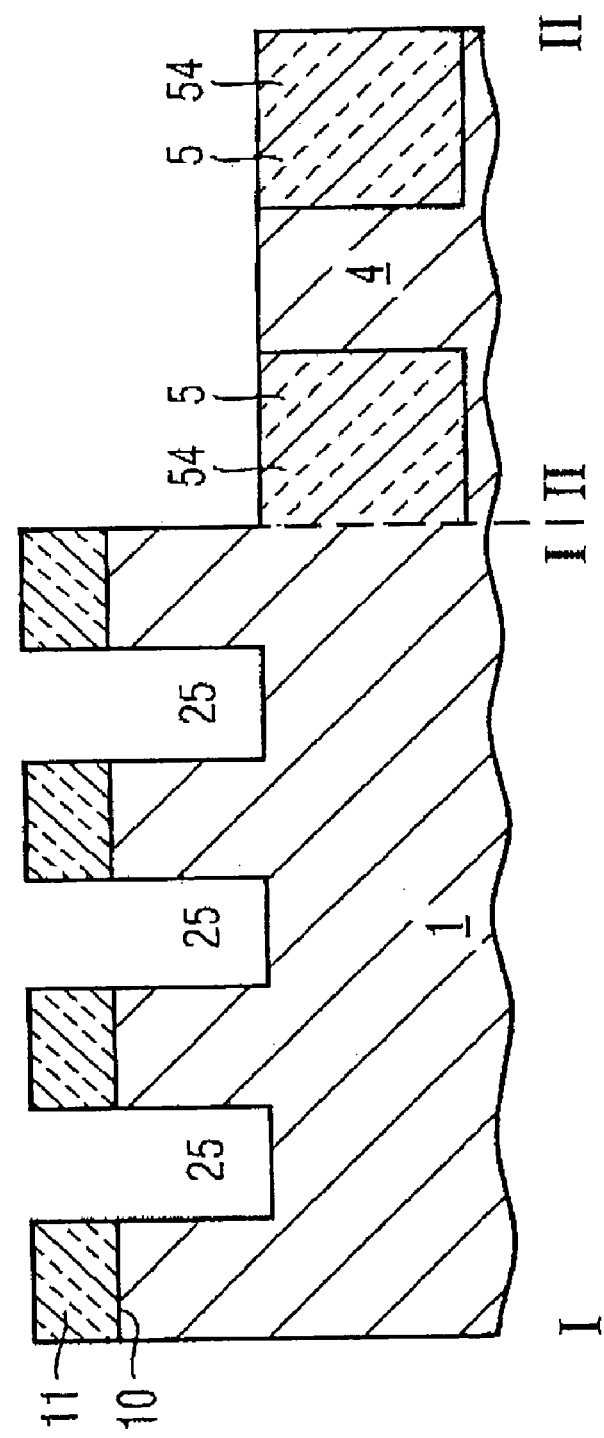
Figure 4B:
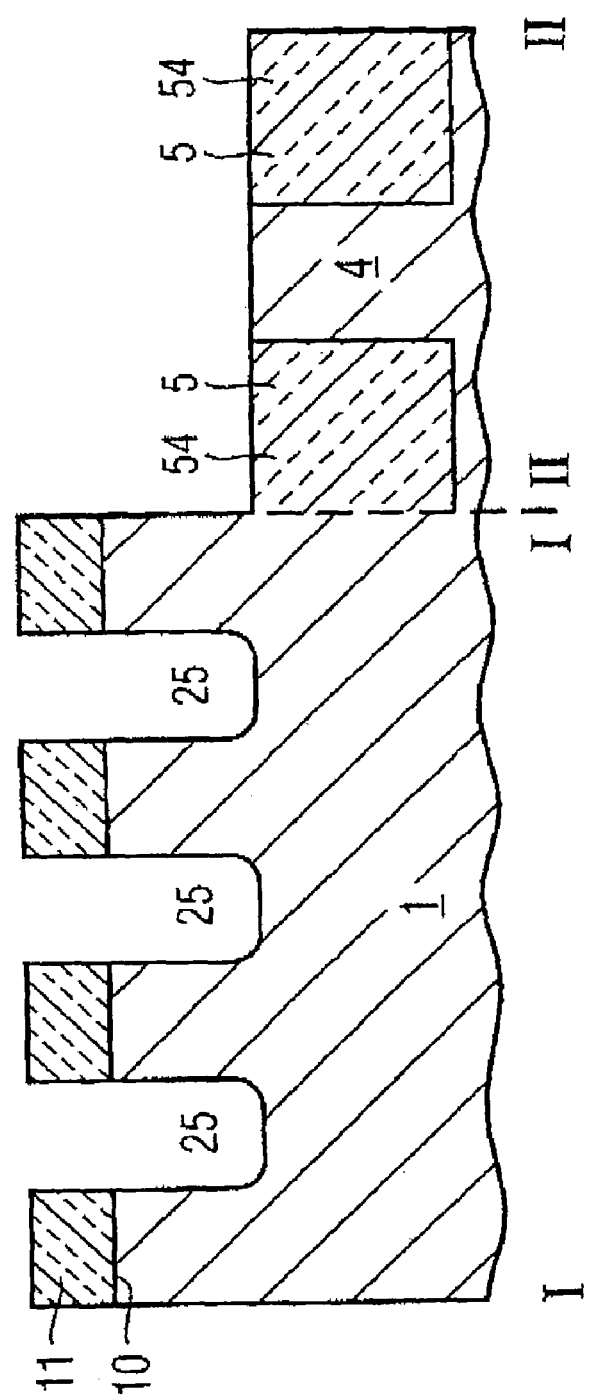

Thereafter, an isotropic etching step, for example, a wet etching step or a dry etching step, in particular, a so-called CDE (chemical downstream etching) step is performed so as to etch silicon and silicon dioxide. Thereby, the gate grooves 25 are widened. The resulting structure is shown in FIG. 4A. In addition, by this isotropic etching step, also the corners of the gate grooves 25 at a bottom face there of are rounded. FIG. 4B shows a cross-section of the resulting structure, in which the corners of the gate grooves are rounded so as to avoid a non-uniform electrical field at these portions.

Next, optionally, a sacrificial oxidation step and subsequent stripping step for removing the sacrificial oxide layer can be performed. Thereafter, a thermal oxidation step for growing a gate oxide is performed. The gate oxide 21 is formed in the two grooves 25 in which later the word lines will be formed, whereas in the right hand groove 25, in which later the isolation gate line 3 will be formed, a gate dielectric 31, having the same thickness as the gate oxide 21 is formed. Thereafter, a metal layer is deposited in the gate grooves 25.

Figure 5:
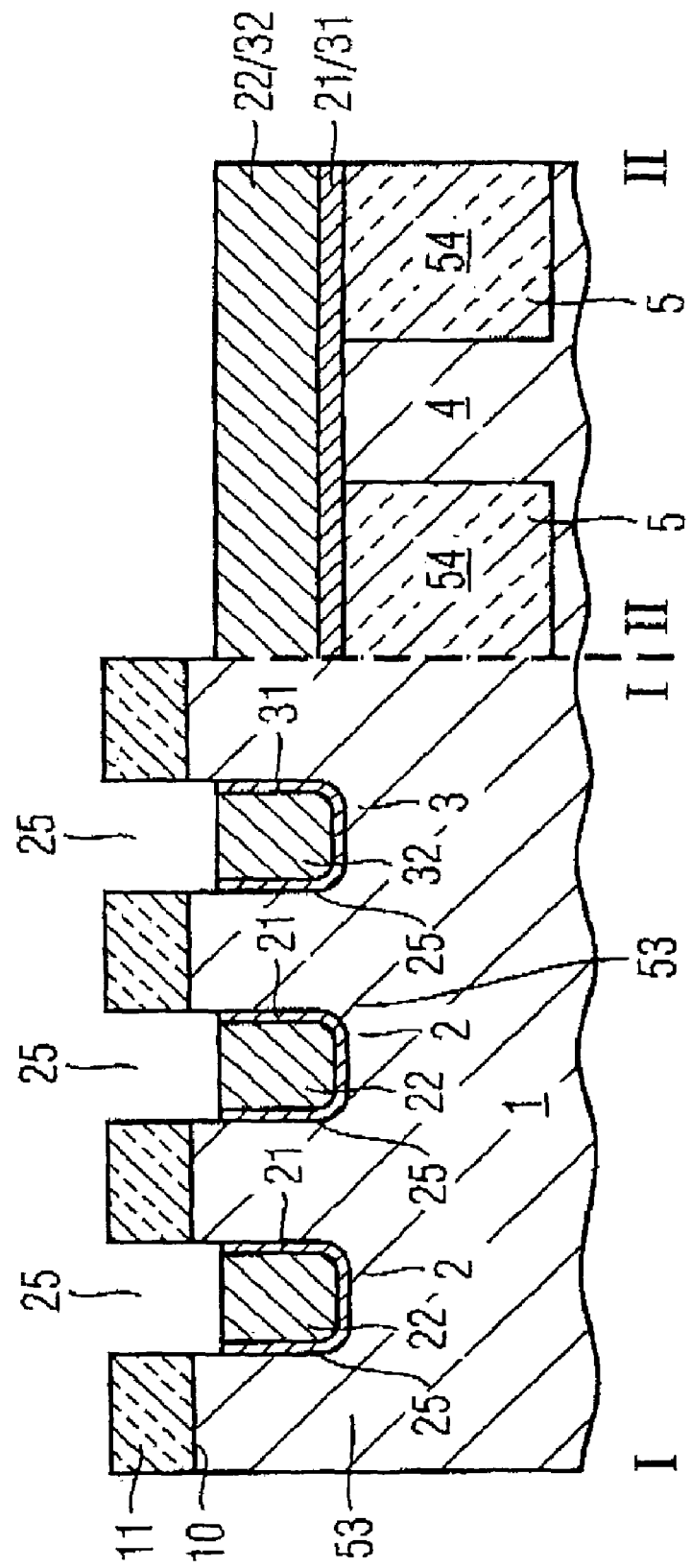

Examples of the metal to be used comprise TiN and W. Thereafter, the metal layer is recessed so as to form the high conductivity layers 22 and 32, respectively. In the cross-sectional view between II and II, the stack comprising the gate oxide layer 21/31 and the high conductivity layer 22/32 is deposited as stripes. The resulting structure is shown in FIG. 5.

In the next step, a silicon oxide layer 23 and 33 is deposited by generally known methods so as to fill the upper portion of the gate grooves. Thereafter a CMP (chemical mechanical polishing) step is performed so as to provide a smooth surface. A resulting structure is shown in FIG. 6A.

Figure 6A:
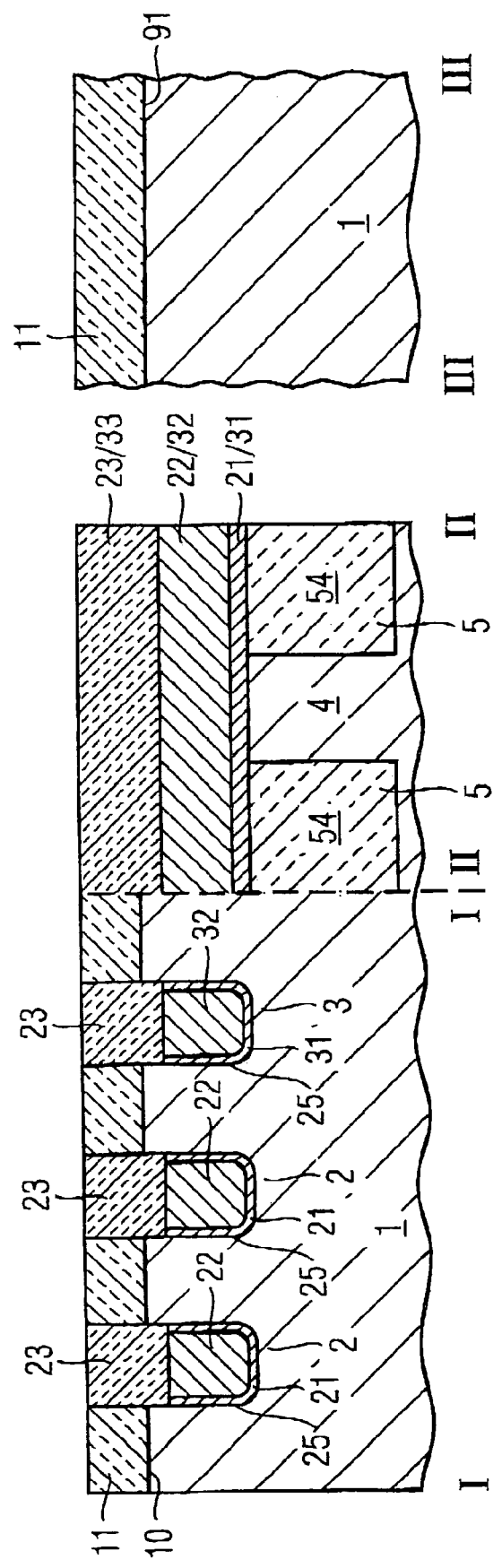
Figure 6B:
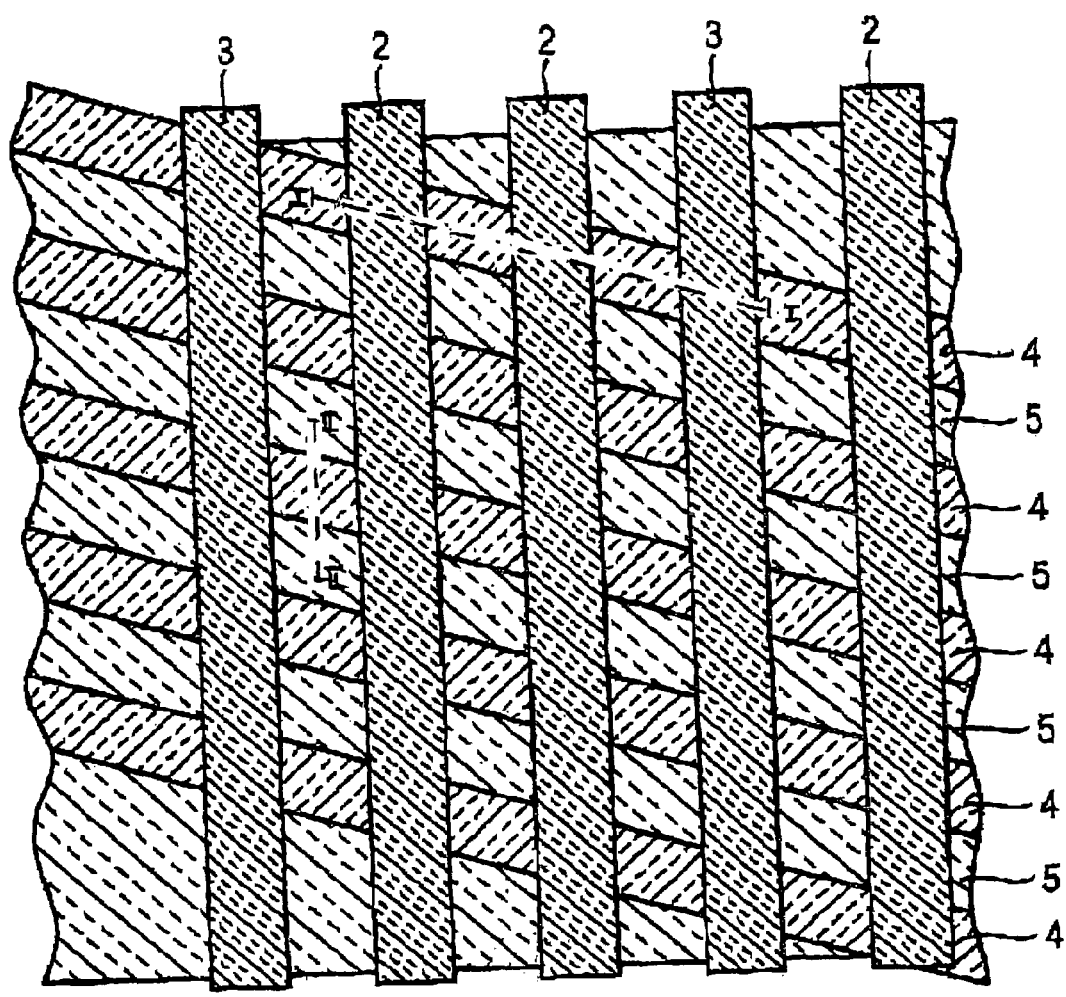
Figure 7B:
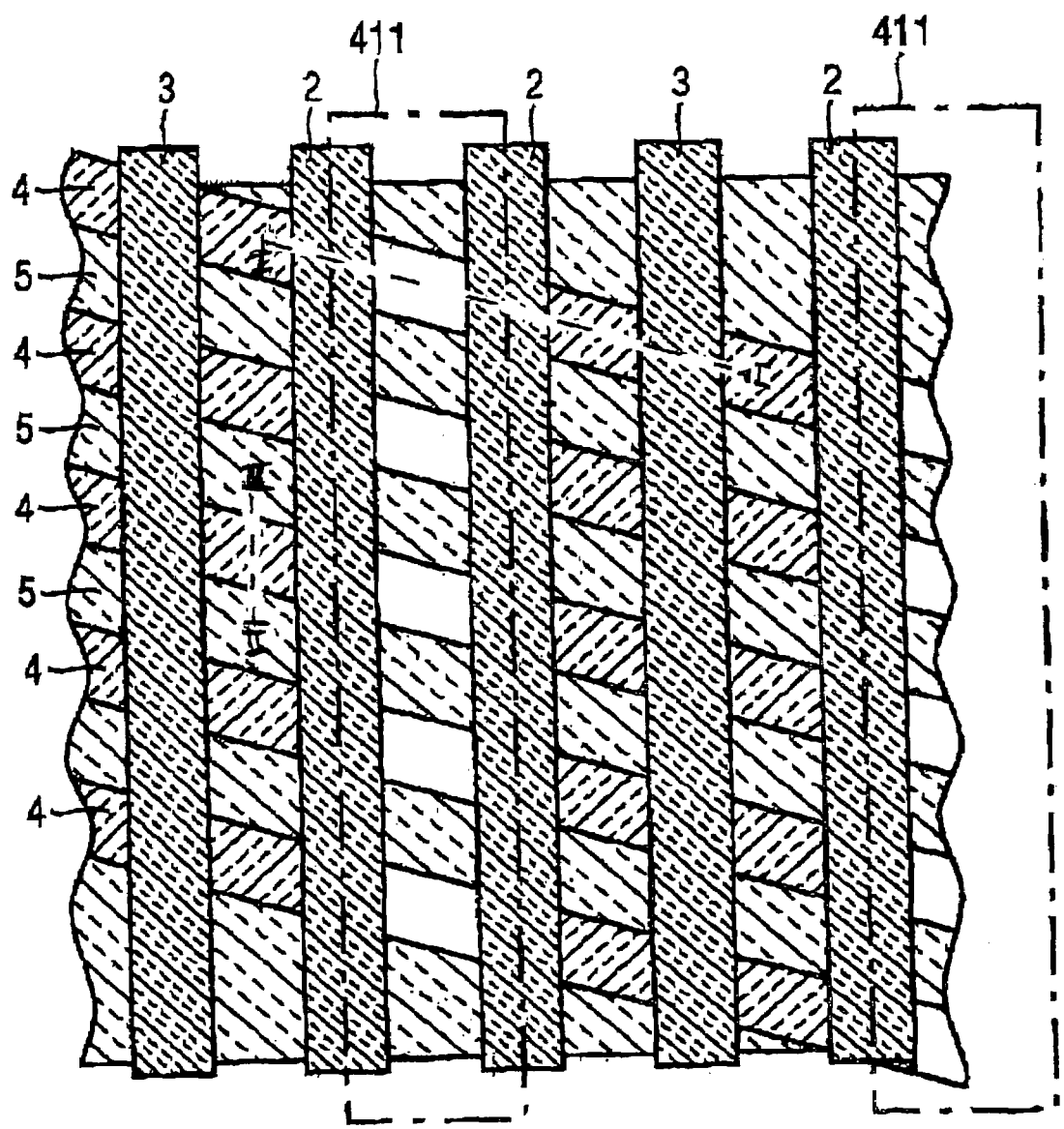

FIG. 6B shows a plan view on the resulting memory cell array. As can be seen from FIG. 6B, the word lines 2 and the isolation gate lines 3 are laid over the active area lines 4. Accordingly, in a plan view, stripes of silicon oxide and silicon nitride portions can be seen. Stated more concretely, in a plan view, stripes of silicon nitride are segmented by stripes of silicon oxide. The stripes of silicon nitride cover the active areas, whereas the stripes of silicon oxide lying over the active areas, cover the word lines. Beneath the exposed portions of the silicon nitride lines, the active area sections which will later be connected with the bit line contacts or the storage capacitors, are disposed. Since in the plan view the surface of the processed semiconductor substrate is covered with silicon nitride at those portions at which contacts to the above are to be made, the positioning of these contacts becomes easy.

The right hand side of FIG. 6A shows a cross-sectional view between III and III, illustrating a cross section of the peripheral portion of the memory cell array. In the right hand side of FIG. 6A, the silicon nitride layer 11 is formed on the peripheral surface 91 of the substrate.

In the next step, the memory cell array is covered by a block mask (not shown) which is for example made of a suitable resist material such as photoresist or polysilicon. The block mask is intended to cover large areas of the wafer to be processed. While the memory cell array is covered by the block mask, the peripheral portion, as illustrated by between III and III on the right hand side of FIG. 7A and as is also illustrated in FIG. 15, is left exposed.

In the next step, an etching step for removing the pad silicon nitride layer 11 and the pad silicon oxide layer (not shown) is performed. This etching step can for example be a dry etching step. Thereafter, the block mask is removed from the memory cell array.

Then, a sacrificial oxidation, in particular, a thermal oxidation step is performed, for proving a sacrificial oxide layer which acts as a scattering oxide during the following implantation step. Thereafter, implantation steps for forming doped regions, in particular, well regions and for setting a threshold voltage of the resulting transistors, are performed in the peripheral portion. Then, the sacrificial oxide layer is removed.

In a next step, a thermal oxidation step is performed for growing a gate oxide layer. In particular, this step can be performed so that different thicknesses of the gate oxide layer can be formed for different transistors in the peripheral portion. Thereafter, a thin polysilicon layer 93 is deposited. The thickness of the polysilicon layer 93 is selected so that the resulting surface has the same level as the silicon nitride layer 11 in the array portion.

Thereafter, the peripheral portion is covered by a block mask, whereas the memory cell array is left exposed. The polysilicon layer of the memory cell array portion is removed by known processes. Thereafter, the block mask is removed from the peripheral portion.

In the next step, the bit line contacts are photolithographically defined. As can be seen from FIG. 7B which shows a plan view on the resulting memory cell array, a block mask 411 having openings in the form of stripe a width of 2 F is used. To this end, first, a photoresist layer is applied to the surface of the memory cell array, and it is photolithographically patterned using the stripe mask.

In the next step, for opening the bit line contact sections, the silicon nitride layer 11 is etched, for example by dry etching in the exposed portions. Since this etching step is selective with respect to the silicon dioxide portions 23, and in addition, the pad nitride layer 11 covering the active area lines 4 is masked by the insulating layer 23 covering the word lines 2 at those portions at which no bit line contact is to be made, the overlay of the bit line contact mask openings 411 is not critical.

Thereafter, the first and second source/drain regions 51, 52, 52' are defined, for example, by ion implantation. The resulting structure is shown in FIG. 7A.

Figure 8A:
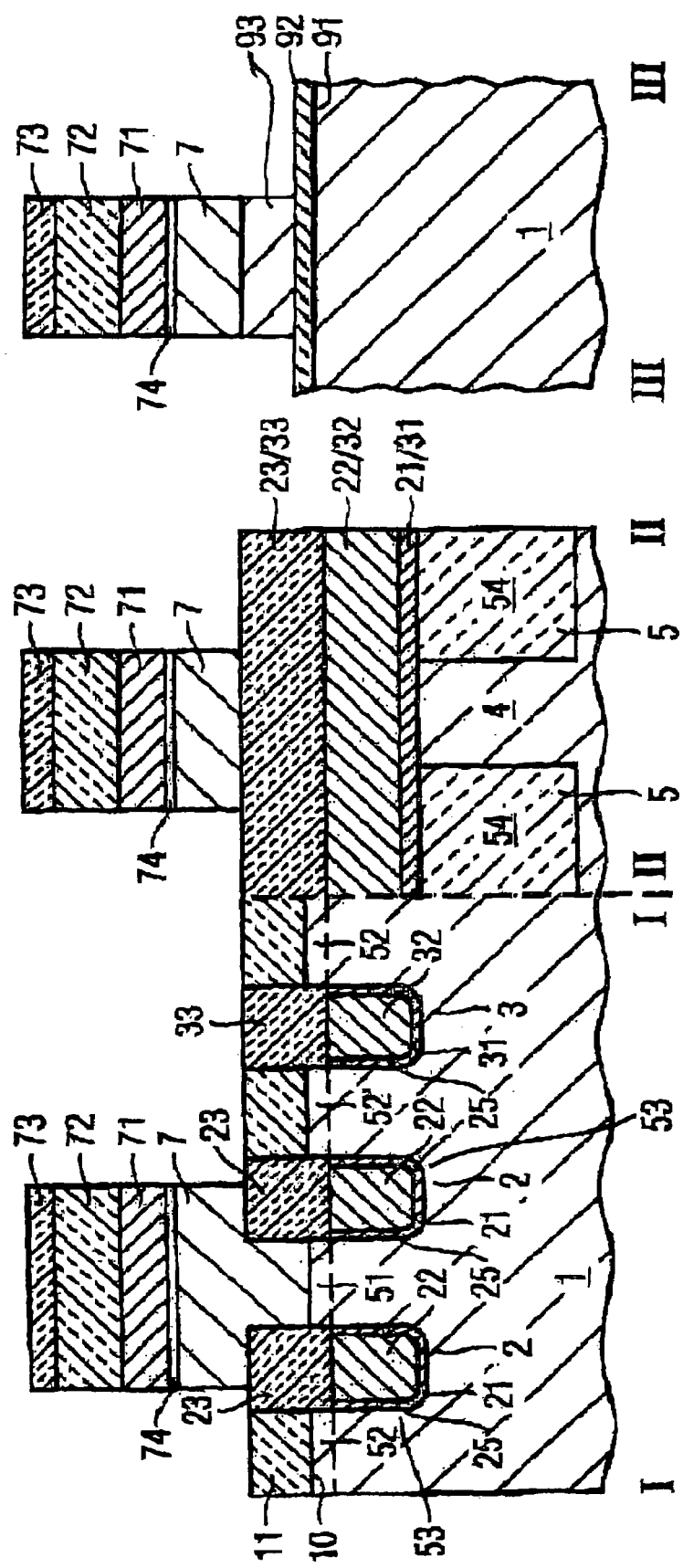

In a next step, a polysilicon layer 7 having a thickness of approximately 20 to 30 nm, optionally, a thin barrier layer 74, a high conductivity layer such as a tungsten layer 71 having a thickness of approximately 40 nm, a silicon nitride layer 72 as well as a silicon oxide layer 73 are deposited on the resulting surface. The barrier layer 74, which can for example be made of Ti, TiN or WN, prevents the polysilicon layer 7 from reacting with certain kinds of high conductivity layers. In addition, the barrier layer reduces the interface resistance between polysilicon and the high conductivity layer. Thereafter, the bit lines in the memory cells and the gate electrodes of the peripheral portion, respectively, are lithographically patterned. To this end, first, a photoresist layer is applied on the deposited layer stack and, thereafter, it is exposed using a suitable mask having a stripe pattern and developed. Thereafter, an etching step is performed so as to provide the bit line stack and the gate stack as shown in FIG. 8A.

The right hand side of FIG. 8A again shows a cross-section of the peripheral portion between III and III. In FIG. 8A, a cross-section of the word lines as well as that of the bit lines is shown. By the step of defining the gate stack of the peripheral portion, also the bit lines of the memory cell array are patterned.

In the left hand portion, between I and I as well as between II and II the cross-section of the bit line stack is shown. It is to be noted that the cross-section between II and II is taken perpendicularly with respect to the bit line, whereas the cross-section between I and I is taken along an active area line and, accordingly, is taken obliquely with respect to the bit line 8. Hence, the bit line 8 has a smaller width between II and II than between I and I.

Figure 8B:
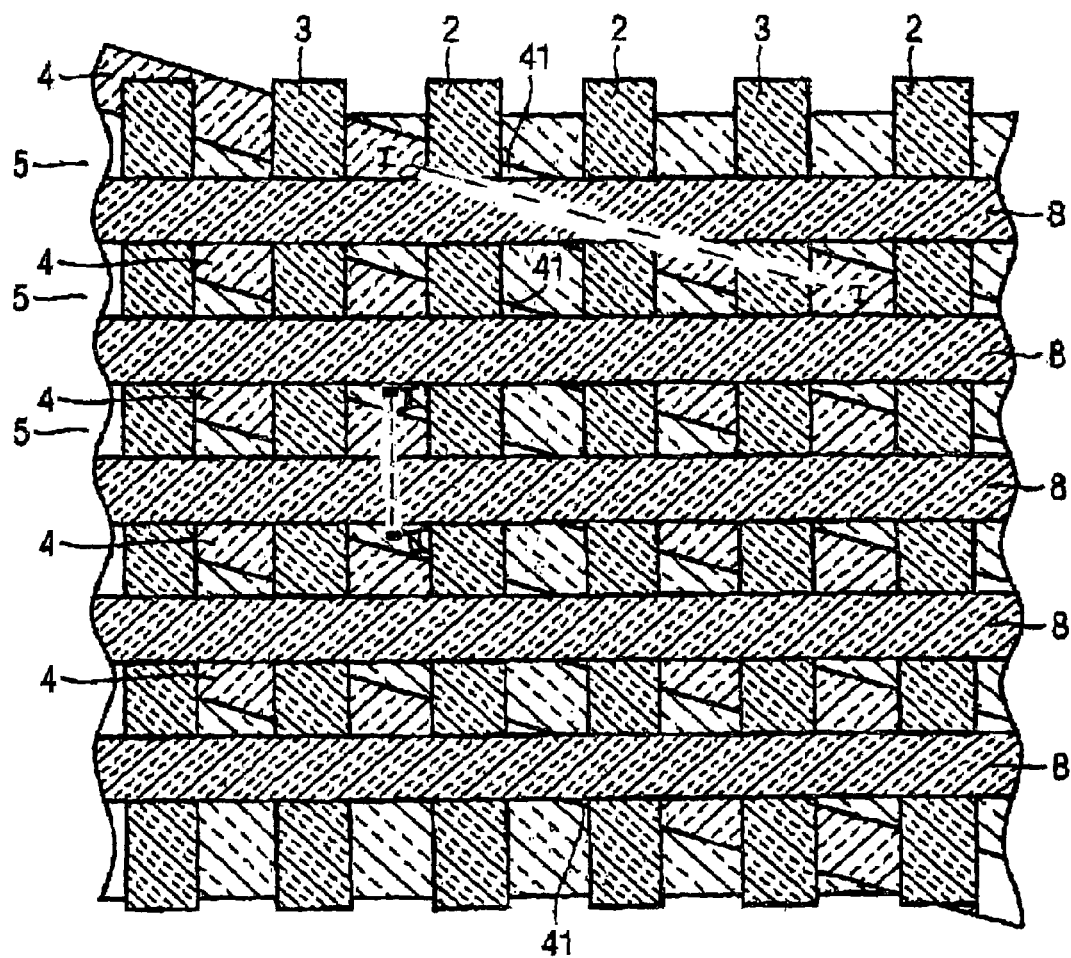

FIG. 8B shows a plan view of the resulting memory cell array. As can be seen from FIG. 8B, the word lines and the isolation gate lines are arranged in a first direction whereas the bit lines 8 are arranged in a second direction, the first direction being perpendicular to the second direction. Beneath the bit lines, active area lines are arranged intersecting the bit lines at a slanted angle. At the crossing points of the active area lines and the bit lines, bit line contacts 41 are formed.

Figure 9:
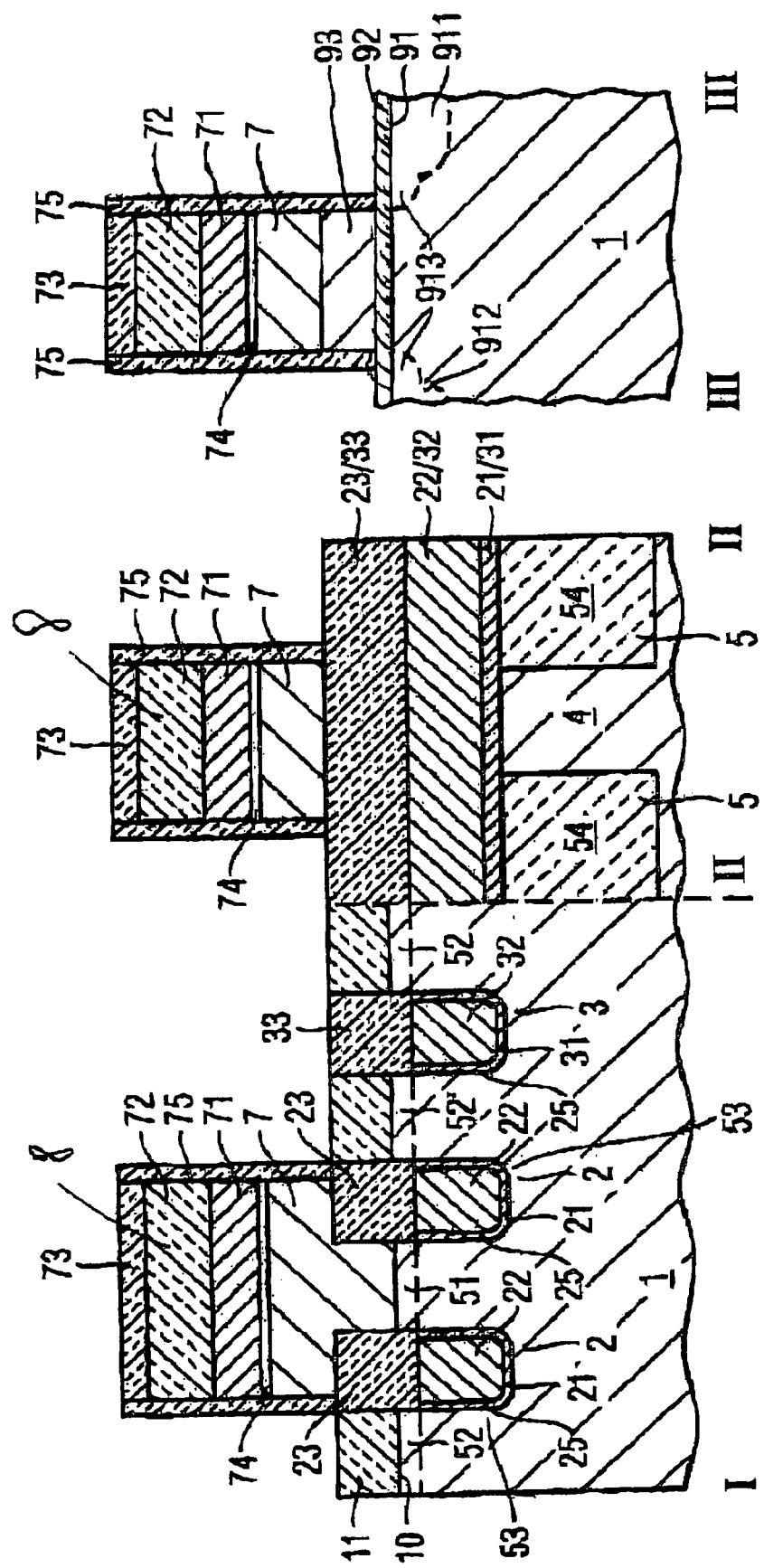

In the next step, optionally, a reoxidation step is performed for the peripheral portion, so as to grow a sidewall oxide at the gate stack. Thereafter, the so-called x-implantation step which is performed before defining the spacer in the peripheral portion, is performed for defining the extended source/drain regions 913 as shown in FIG. 9, for example. Thereafter, a thin silicon dioxide layer 73 (FIG. 9) is deposited as a conformal layer and is anisotropically etched so as to form a silicon dioxide spacer 75. Optionally, a disposable polysilicon spacer 76 for the peripheral portion can be provided. Thereafter, the so-called y-implantation steps which are usually performed after forming the spacer in the peripheral portion, are performed. Thereby the source/drain regions 911, 912 of the peripheral transistor are defined. After completing the definition of the source/drain regions 911, 912, the disposable polysilicon spacer 76 is removed. Due to the presence of the disposable polysilicon spacer 76 during the implantation of the source/drain regions 911, 912, a sufficient distance between the source/drain regions 911, 912 and the extended source/drain regions 913 can be maintained.

The silicon dioxide spacer of the bit line provides an electrical isolation between the bit line and the node contact which is to be formed in a later step. Due to their large distance, the electrical isolation between the bit line and the second source/drain region 52, 52' in the memory cell array is less critical than the electrical isolation between the gate electrode and the first and second source/drain regions 911, 912 in the peripheral transistor. In particular, the gate electrode of the peripheral transistor is disposed adjacent to the source/drain regions 911, 912.

The thinner the thickness of the spacer, the larger the overlap capacity between bit line and node contact. Nevertheless, by reducing the array spacer thickness, the contact area of the node contact can be made larger and, consequently, the resistance of this contact can be decreased. The resulting structure is shown in FIG. 9.

Figure 10:
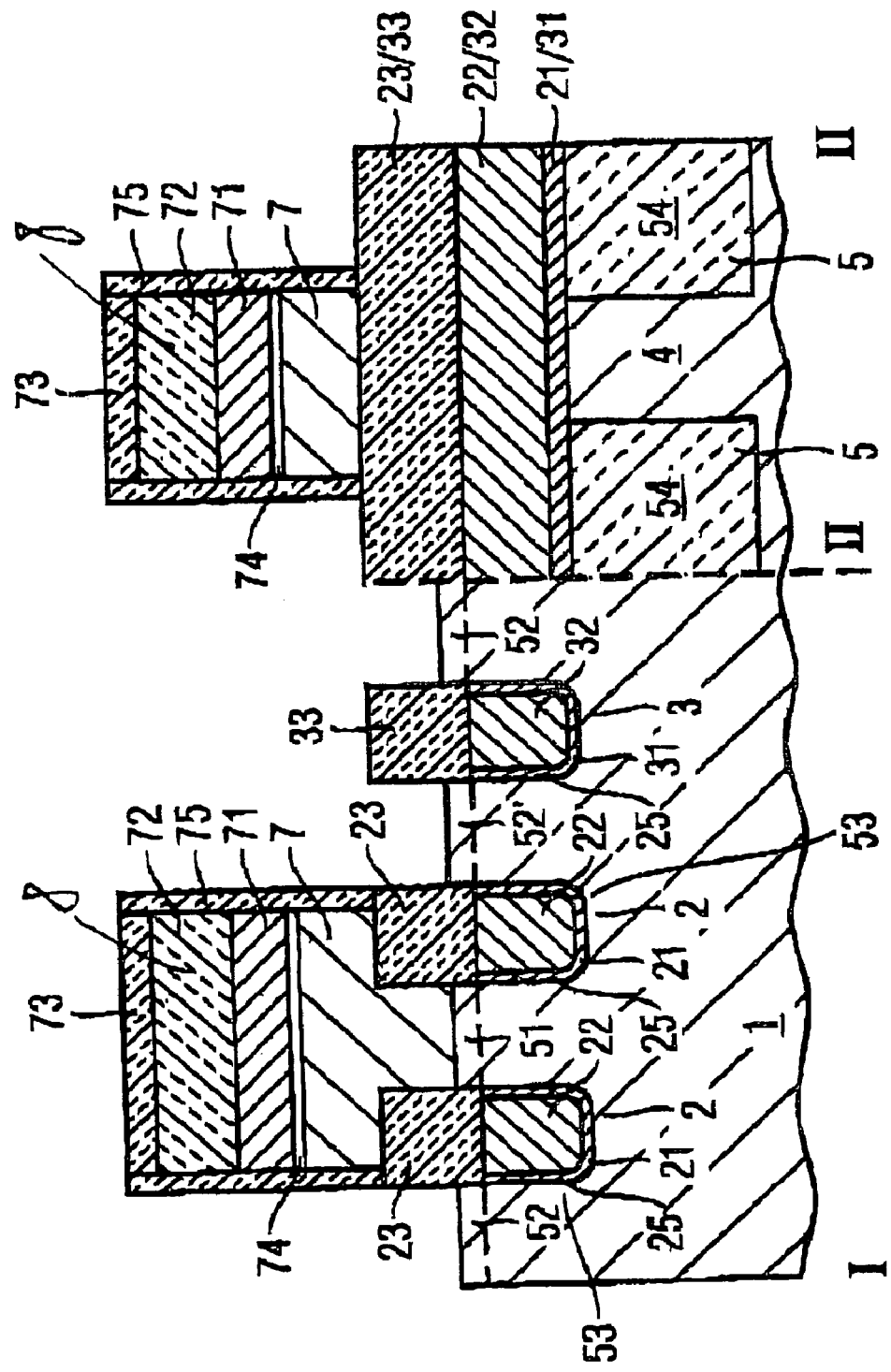

In a next step, the silicon nitride layer 11 is etched by a dry etching step, so as to remove all the exposed silicon nitride portions. The resulting structure is shown in FIG. 10.

Figure 11:
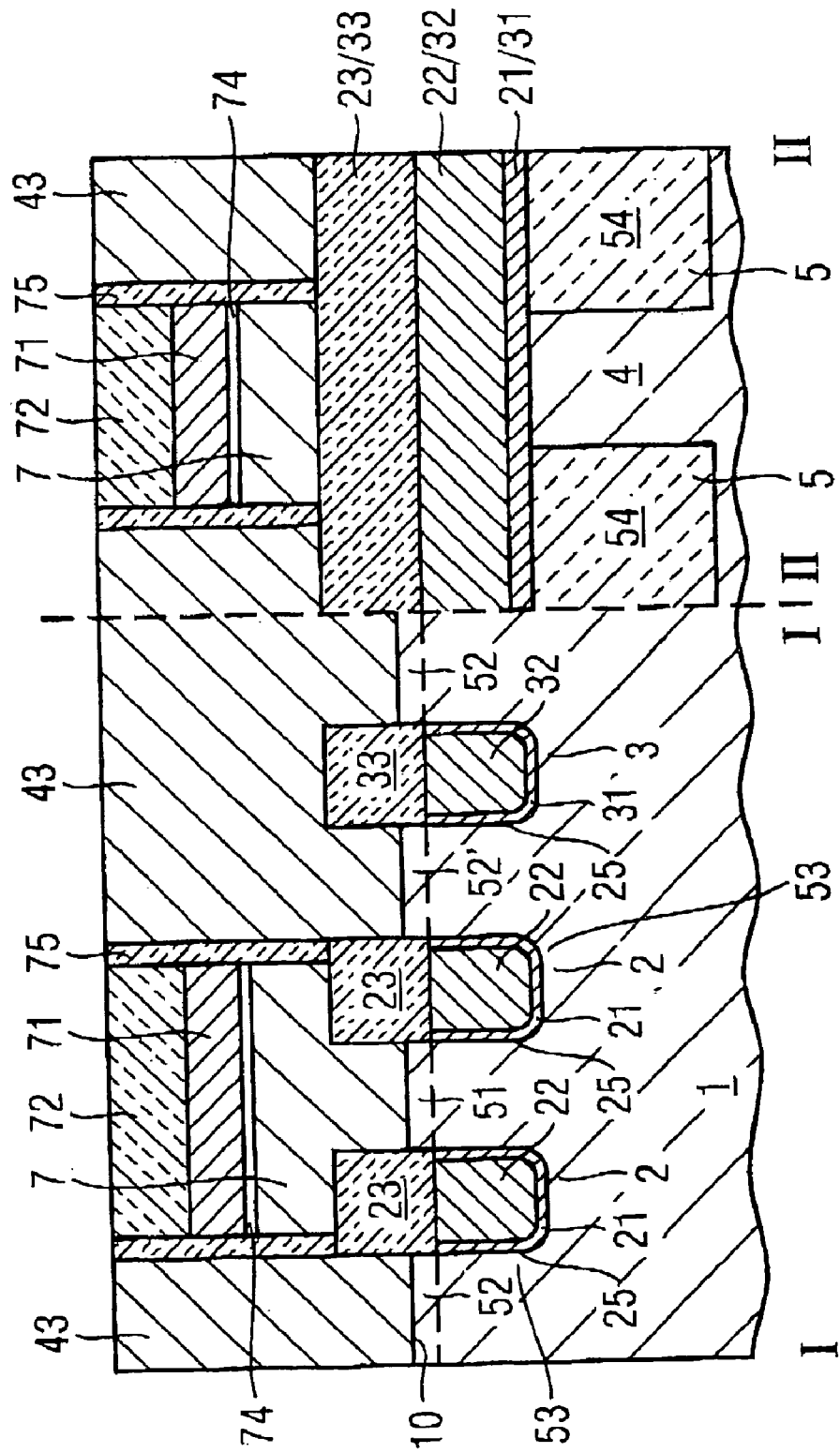

Thereafter, optionally, an implantation step can be performed so as to reduce the contact resistance between the second source/drain region and the capacitor contact. Thereafter, a polysilicon layer 43 is deposited and the resulting surface is planarized by performing a CMP step. The resulting structure is shown in FIG. 11.

Figure 12:
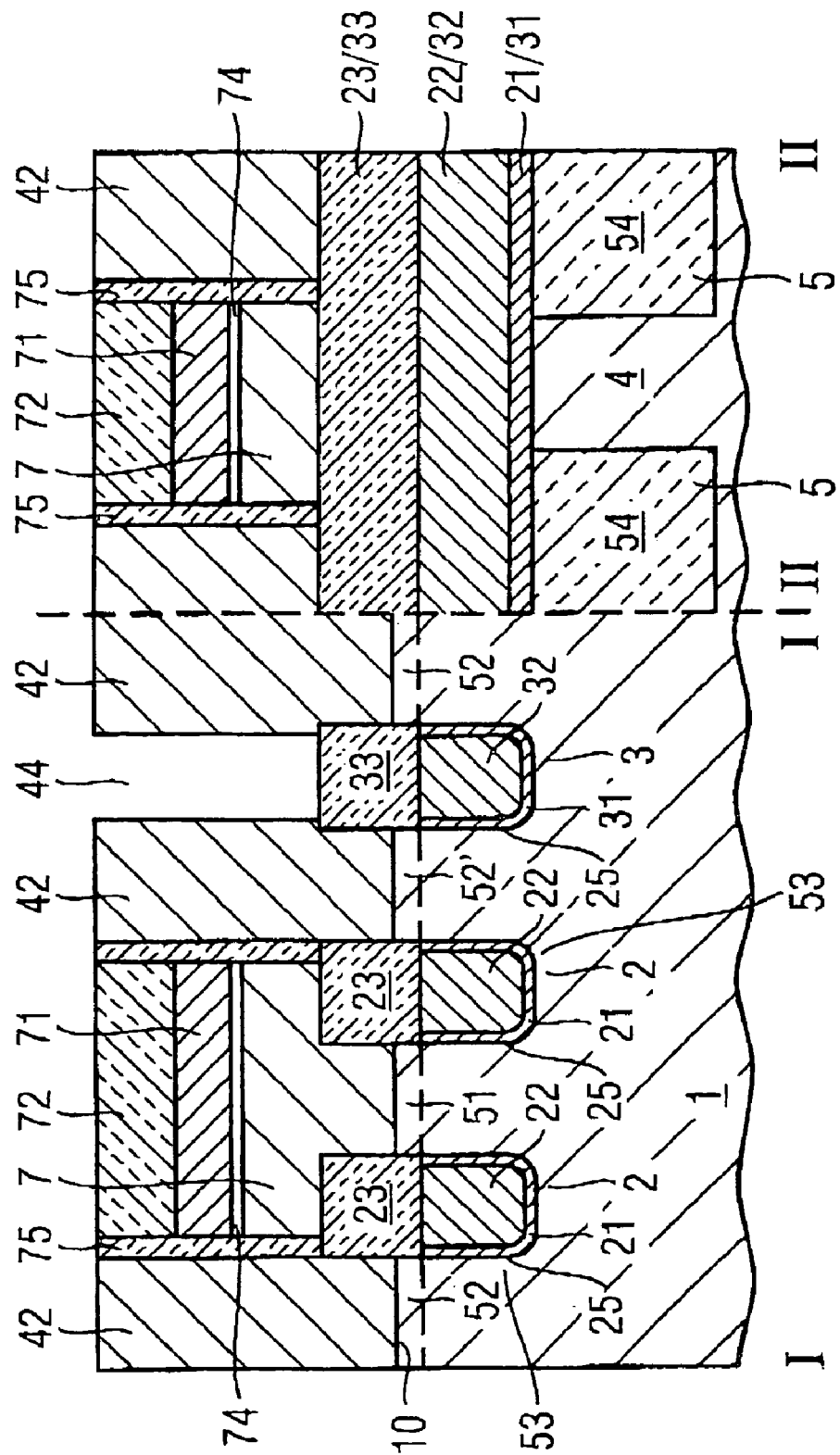

In the next step, optionally, a hard mask layer (not shown) may be deposited so as to define the node contact connecting the second source/drain region and the storage electrode of the storage capacitor to be to be formed later. Thereafter, the capacitor contact is photolithographically defined by using a mask having a stripe pattern. To be more specific, by using a mask having a stripe pattern, isolation grooves 44 laying above the insulating layer 33 of the isolation gate line 3 are defined, so as to electrically isolate adjacent capacitor contacts 42 from each other. The resulting structure is shown in FIG. 12.

In the next step, an isolating material such as a spin-on-glass is deposited so as to fill the isolation grooves 44 and a CMP step is performed so as to provide a smooth surface. Thereafter a silicon nitride layer 45 is deposited so as to provide an electrical isolation of the resulting memory cell array. The resulting structure is shown in FIG. 13A.

Figure 13B:
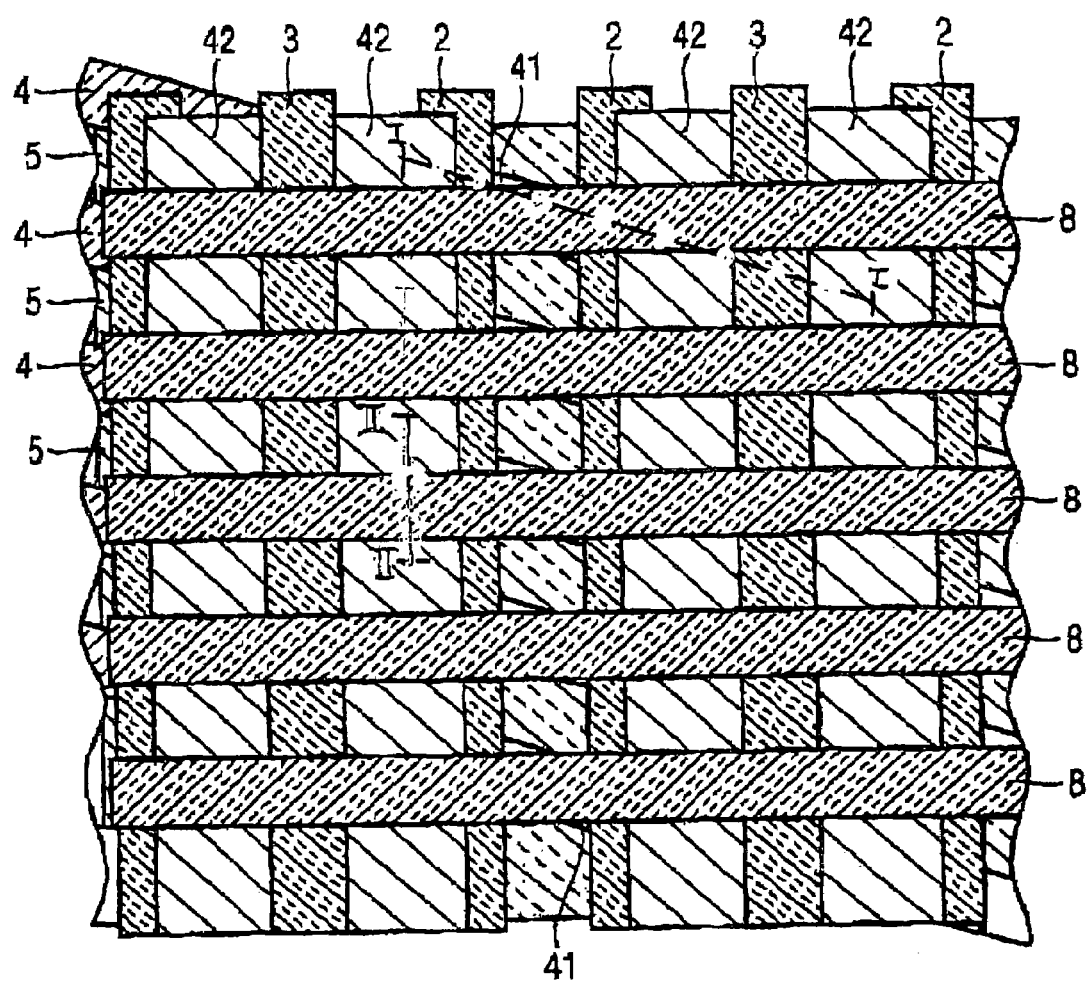

FIG. 13B shows a plan view of the resulting memory cell array after defining the node contacts and performing the CMP step and before depositing the silicon nitride layer 45. As can be seen from FIG. 13B, the node contacts are at all the portions between gate isolation line and word lines between adjacent bit lines 8. In FIG. 14, a possible layout of the stored capacitors 63 is illustrated. Nevertheless the storage capacitors 63 can be moved by 0.5 F along the direction of the word line, in particular, for obtaining a checkerboard arrangement of the storage capacitors.

Figure 14A:
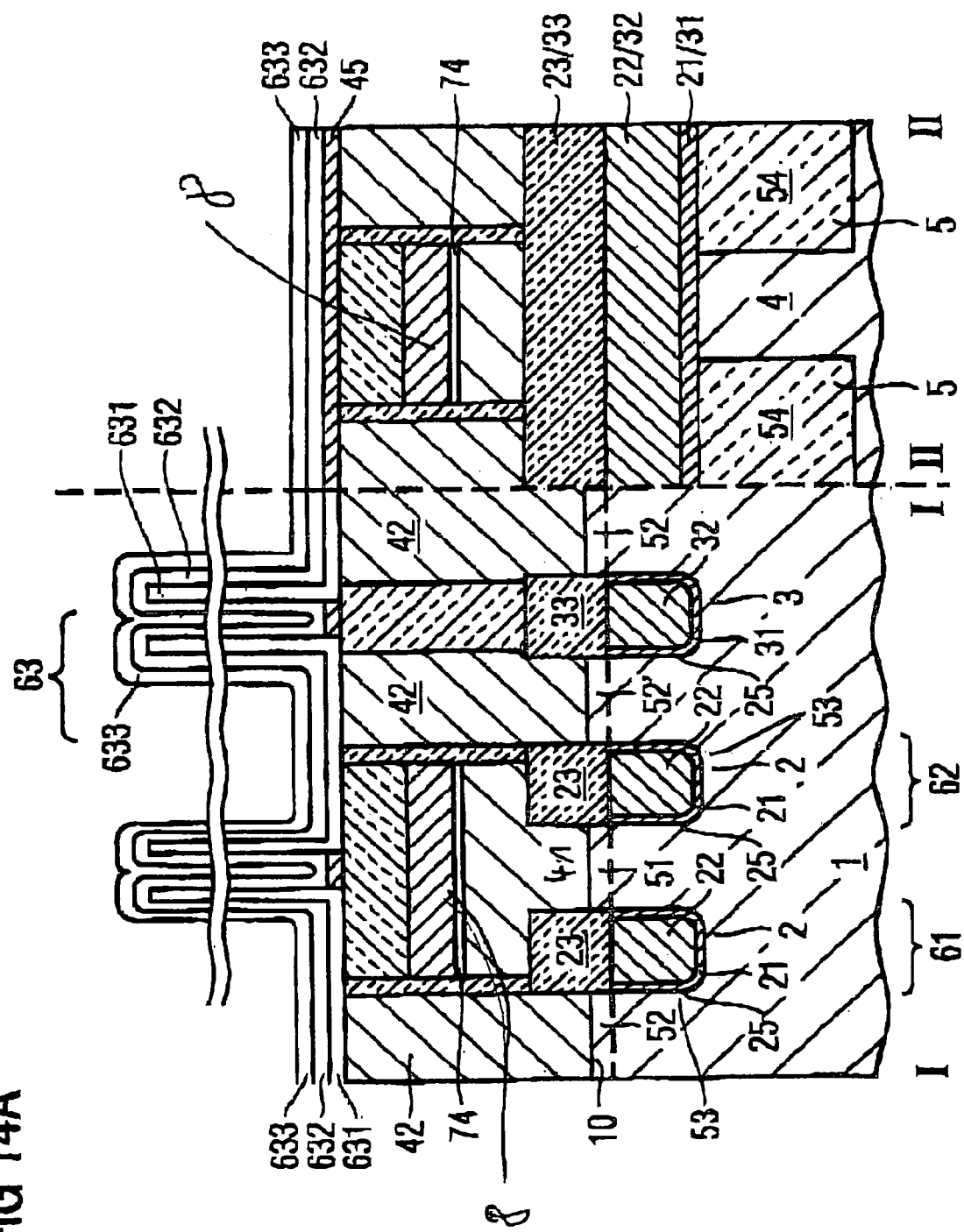
FIGS. 14A and 14B illustrate a cross-section and a plan view, respectively, of the memory cell array of the present invention after completing the storage capacitor.

In the next steps, the usual steps for completing the memory cell device are performed. In particular, the stacked capacitor is defined by providing a first capacitor electrode 631, a capacitor dielectric 632 as well as the second capacitor electrode 633, the contacts for contacting the peripheral portion are provided and the remaining metallization layers are provided. FIG. 14A shows a cross-section of the memory cell array after defining the storage capacitor 63.

According to the present embodiment, the storage capacitor 63 is implemented as a stacked capacitor. Nevertheless, it is obvious to the person skilled in the art that any storage element suitable for storing an information can be used instead of the stacked capacitor as shown in FIG. 14A. In particular, alternative storage elements which are disposed above the surface 10 of the semiconductor substrate can be used. The storage capacitor 63 includes a first capacitor electrode 631, a capacitor dielectric 632 and a second capacitor electrode 633 which can be arranged in the manner shown in FIG. 14A. In particular, the height of the storage capacitor amounts to about 2 to 3 µm. The term "height" refers to the distance of the topmost portion of the first capacitor electrode 631 to the lowest portion of the first capacitor electrodes 631 as seen in the depicted cross-section of FIG. 14A.

The cross-section of the first capacitor electrode in a plane parallel to the substrate surface 10 can be arbitrary. For example, this cross-section can have an oval, circular or nearly rectangular shape. The capacitor 63 is formed by generally known methods, and the materials for constituting the first and the second capacitor electrodes 631, 633 and the capacitor dielectric 632 can be those as commonly used in the art.

Figure 14B:
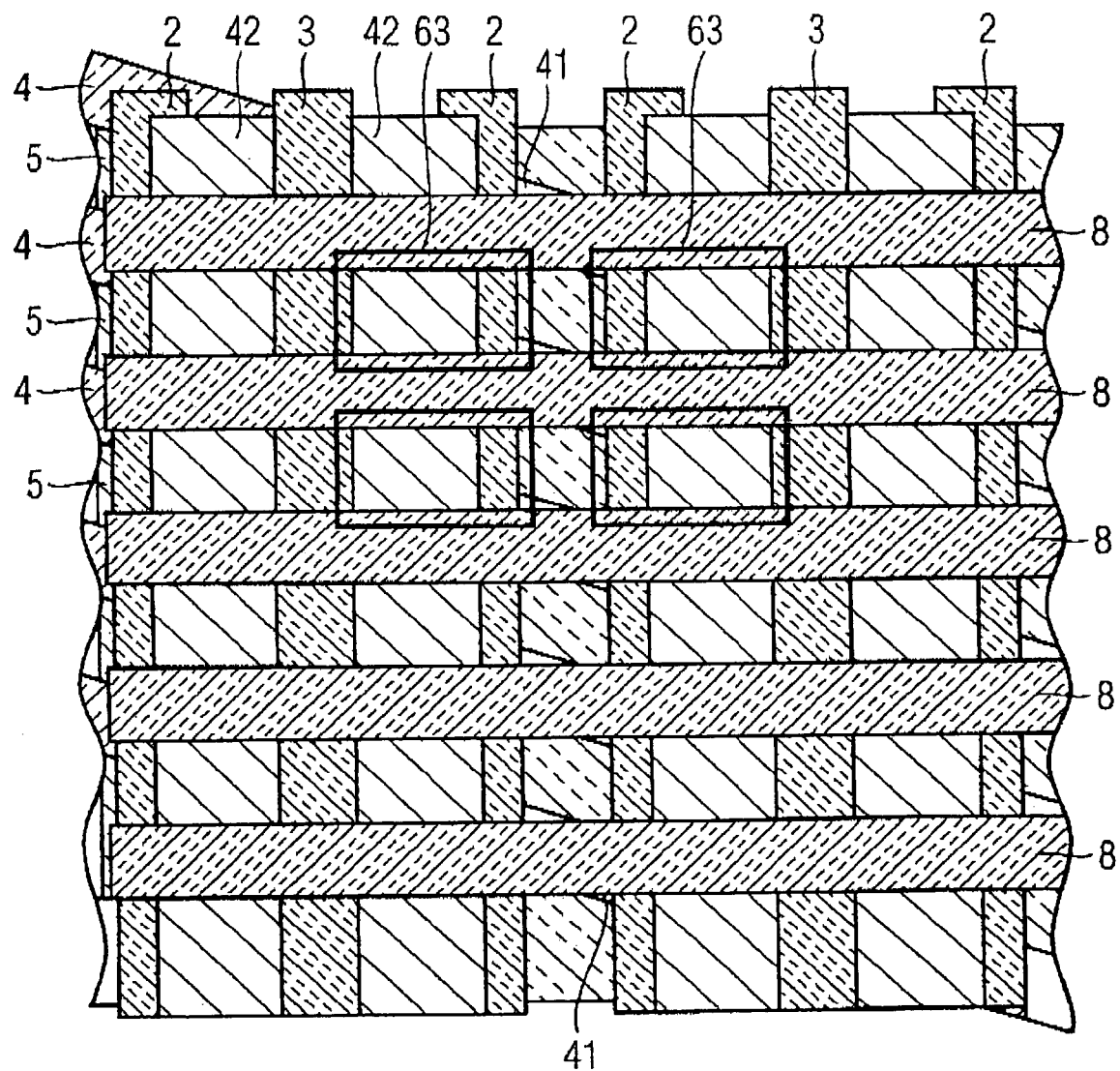

FIG. 14B shows a plan view on the resulting memory cell array. As can be seen, storage capacitors 63 are arranged in a regular manner so as to be connected with the node contacts. According to another embodiment of the present invention, the storage capacitors 63 can be arranged in a different manner, for example, so as to form a checkerboard pattern. In particular, the storage capacitors 63 of neighbouring memory cell columns can be moved in a vertical direction by 0.5 F.

FIG. 15 shows a plan view of the resulting memory device including the memory cell array 60 and the peripheral portion 9. Usually, the peripheral portion 9 includes the core circuitry 94 including row drivers and sense amplifiers and other devices for controlling and addressing the individual memory cells, and the support 95 which usually lies outside the core circuitry. According to the present invention, all parts outside the memory cell array belonging to the memory device are referred to as the peripheral portion 9.

As is shown in FIG. 15, a plurality of bit lines 8 are formed along a horizontal direction whereas a plurality of word lines 2 are arranged in a second direction which is perpendicular to the first direction. In addition, continuous active area lines 4 are disposed at a slanted angle with respect to the bit lines and the word lines, respectively. As can be seen, neighbouring active area lines 4 are separated and electrically isolated from each other, by isolation trenches 5 which are filled with an isolating material such as silicon dioxide.

Additionally, isolation gate lines 3 are disposed along the second direction. More specifically, one isolation gate line 3 is disposed between pairs of neighbouring word lines 2. In particular, the active area lines 4 are formed so that they extend continuously from one edge of the memory cell array to another edge of the memory cell array. It is further preferred, that an angle between the active area lines and the bit lines amounts to 10° to 60°. An angle from 10° to 25° is especially preferred. In particular, the angle can amount to approximately 18°.

As can be seen from FIG. 15, two neighbouring memory cells 6 share one common bit line contact 41. Accordingly, two node contacts 42 of a bit line 8 are followed by one bit line contact 41 and two neighbouring bit line contacts of one active area line 4 are assigned to two different bit lines 8. Hence, a horizontal distance of neighbouring bit line contacts preferably amounts to 6 F, whereas a vertical distance of neighbouring bit line contacts preferably amounts to 2 F. As a consequence, an angle between the bit line 8 and the active area line 4 of about 18°, in particular 18.43°, is especially preferred, since 18.43° amounts to arctan(⅓).

As a further modification, the continuous active area lines can as well be implemented as angled lines, instead of the straight lines shown in FIG. 15. For example, the active area lines can comprise horizontal sections and slanted sections. As an alternative, the active area lines 4 can be implemented as angled lines having two different angles with respect to the bit lines 8, both angles being different from 0°. As is shown in FIG. 15, one active area line 4 crosses a plurality of bit lines 8, thus forming a plurality of bit line contacts with different bit lines. In particular, neighbouring bit line contacts 41, each of the neighbouring bit line contacts 41 being connected with one active area line 4, are connected with neighbouring bit lines 8.

Figure 16:
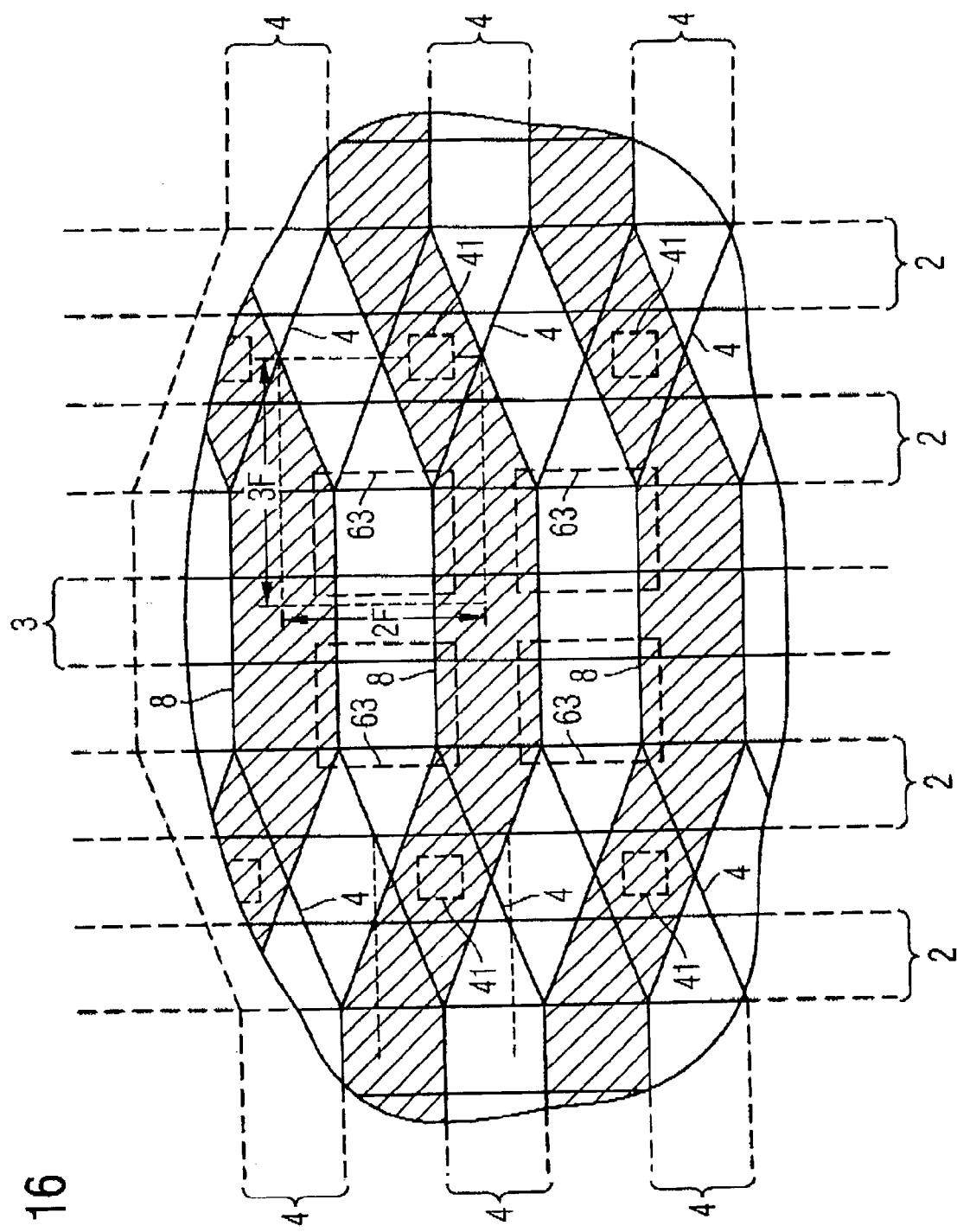
FIG. 16 shows an exemplary layout of the memory cell array of the present invention.

Alternatively, the active area lines 4 and the bit lines can as well be arranged in the manner shown in FIG. 16. In FIG. 16, the continuous active area lines 4 and the bit lines 8 are formed in a weaving manner, so that there are many points of intersection between a specific active area line and a specific bit line 8. At a point of intersection between an active area line 4 and a bit line 8, a bit line contact 41 is formed. Additionally, storage capacitors 63 are indicated. In the layout shown in FIG. 16, isolation gate lines 3 are arranged, so as to electrically isolate pairs of adjacent memory cells from each other. In particular, in the arrangement of FIG. 16, two adjacent memory cells share one common bit line contact 41. In the layout shown in FIG. 16, two neighbouring bit line contacts, each of the neighbouring bit line contacts being connected with one active area line 4, are connected with the same bit line 8.

Nevertheless, the present invention is equally applicable to different layouts of memory cells. In particular, the invention is as well applicable to layouts in which the active areas are not formed as continuous lines but as segments comprising two memory cells.

FIG. 17 is a simplified schematic diagram describing a pair of memory cell arrays 60, 60' in accordance with the present invention. The arrays are implemented in an open bit line configuration, each employing memory cells 6, comprising one transistor 61 and one capacitor 63.

The memory arrays 60, 60' are each coupled to respective groups of bit lines 8, 8' and respective groups of word lines 2, 2'. The two groups of bit lines 8, 8' are coupled, one from each of the memory arrays 60, 60', to sense amplifiers 64. The sense amplifiers 64 comprise peripheral circuitry, generally formed outside of peripheries of the memory cell arrays 60, 60'.

In operation, one memory cell 6 is selected, for example, by activating one word line 2. The word line 2 is coupled to the respective gate electrode of a respective one of the transistors 61. The bit line 8 is coupled to the first source/drain region of one of these transistors 61 via the bit line contacts 41. The transistor 61 is turned on, coupling charge stored in the capacitor 63 to the associated bit line 8. The sense amplifier 64 then senses the charge coupled from the capacitor 63 to the bit line 8. The sense amplifier 7 compares that signal to a reference signal, such as the reference charge Qref or a reference signal which is obtained by sensing a corresponding bit line 8', without a voltage being applied to the corresponding word line 2', amplifies the resulting signal and latches the amplified signal from appropriate duration. This allows data represented by the charge stored in the capacitor 63 to be accessed external to the memory arrays 60, 60' and also allows the capacitor 63 to store charge representative of the data from the memory cell 6 back into the memory cell 6.

As is obvious to the person skilled in the art, an alternative array architecture such as a vertically twisted bit line array architecture which is generally known, can be used as well.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

| List of references | |
|---|---|
| 1 | semiconductor substrate |
| 10 | substrate surface |
| 11 | silicon nitride layer |
| 12 | hardmask layer |
| 13 | hardmask opening |
| 2, 2' | word line |
| 21 | gate dielectric |
| 22 | high conductivity layer |
| 23 | insulating layer |
| 25 | gate groove |
| 3 | isolation gate line |
| 31 | gate dielectric |
| 32 | high conductivity layer |
| 33 | insulating layer |
| 4 | active area line |
| 41 | bit line contact |
| 411 | bit line ontact mask opening |
| 412 | bit line contact opening |
| 42 | node contact |
| 43 | polysilicon |
| 44 | isolation groove |
| 45 | silicon nitride liner |
| 5 | isolation groove |
| 51 | first source/drain region |
| 52, 52' | second source/drain region |
| 53 | channel |
| 54 | silicon dioxide filling |
| 6 | memory cell |
| 60, 60' | memory cell array |
| 61 | first access transistor |
| 62 | second access transistor |
| 63 | storage capacitor |
| 631 | first capacitor electrode |
| 632 | capacitor dielectric |
| 633 | second capacitor electrode |
| 64 | sense amplifier |
| 7 | polysilicon layer |
| 71 | high conductivity layer |
| 72 | silicon nitride layer |
| 73 | silicon dioxide layer |
| 74 | barrier layer |
| 75 | spacer |
| 76 | polysilicon spacer |
| 8, 8' | bit line |
| 9 | peripheral portion |
| 91 | peripheral substrate surface |
| 911 | peripheral source/drain region |
| 912 | peripheral source/drain region |
| 913 | extended peripheral source/drain region |
| 92 | silicon dioxide layer |
| 93 | polysilicon layer |
| 94 | core circuitry |
| 95 | support |
| 96 | peripheral gate electrode |

What is claimed is:

1. A memory device comprising:
memory cells, the memory cells being at least partially formed in a semiconductor substrate having a surface;
bit lines extending in a first direction along the substrate;
gate grooves extending in a second direction along the substrate, the second direction intersecting the first direction, the gate grooves being formed in the semiconductor substrate surface and including word lines disposed in the gate grooves; and
peripheral circuitry comprising at least one peripheral transistor, the peripheral transistor comprising first and second peripheral source/drain regions, a peripheral channel connecting the first and second peripheral source/drain regions and a peripheral gate electrode controlling the conductivity of the peripheral channel, the peripheral gate electrode being formed of a peripheral gate stack comprising at least one layer, the peripheral circuitry being connected with the word lines and the bit lines;
wherein:
each of the memory cells comprises:
an access transistor comprising first and second source/drain regions, a channel disposed between the first and second source/drain regions and a gate electrode that is electrically isolated from the channel and adapted to control the conductivity of the channel, the gate electrode of the access transistor forming part of the word lines and the word lines including a top surface disposed beneath the substrate surface, the access transistor being at least partially formed in the semiconductor substrate, and the first source/drain region being connected with a corresponding one of the bit lines via a bit line contact; and
storage elements for storing information, the storage elements being adapted to be accessed by the access transistor; and
the bit lines including the bit line contacts are made of a bit line stack comprising at least one layer that is identical to the peripheral gate stack.

2. The memory device according to claim 1, wherein each of the storage elements comprises a capacitor comprising at least first and second storage electrodes and at least a capacitor dielectric being disposed between the first and second storage electrodes.

3. The memory device according to claim 2, wherein each of the first and second storage electrodes is disposed above the substrate surface.

4. The memory device according to claim 1, further comprising a cap layer made of an isolating material, which is arranged in the gate grooves above the word lines.

5. The memory device according to claim 1, wherein each of the access transistors are formed in active areas of the substrate, the active areas being formed as continuous lines.

6. The memory device according to claim 5, further comprising isolation gate lines which are adapted to isolate proximately aligned transistors from each other, the isolation gate lines being arranged in parallel with the word lines.

7. The memory device according to claim 6, wherein word lines and gate lines are arranged in a pattern such that individual isolation gate lines are disposed between sets of two word lines.

8. The memory device according to claim 1, wherein the access transistors are connected with corresponding bit lines via bit line contacts, and each bit line contact connects with two proximately aligned access transistors.

9. The memory device according to claim 1, wherein each of the gate grooves includes a bottom surface and two sidewalls, and the grooves are formed so that the bottom surface is rounded near an intersection between the bottom surface and any of the two sidewalls.

10. A method of manufacturing a memory device, comprising:
forming memory cells by providing access transistors, each of the access transistors comprising first and a second source/drain regions, a channel disposed between the first and second source/drain regions and a gate electrode that is electrically isolated from the channel and adapted to control the conductivity of the channel, the access transistors being at least partially formed in a semiconductor substrate including a surface, and by providing storage elements for storing information, each of the storage elements being adapted to be accessed by one of the access transistors;
providing bit lines extending in a first direction along the substrate, the bit lines being connected with the first source/drain regions of the access transistors via bit line contacts;
providing word lines extending in a second direction along the substrate, the second direction intersecting the first direction; and
providing peripheral circuitry, the peripheral circuitry comprising at least one peripheral transistor, the peripheral transistor comprising a first and a second peripheral source/drain regions, a peripheral channel connecting the first and second peripheral source/drain regions and a peripheral gate electrode controlling the conductivity of the peripheral channel, the gate electrode of the access transistor forming part of one of the word lines, the peripheral circuitry being connected with the word lines and the bit lines, wherein a top surface of the word line is disposed beneath the substrate surface, and the peripheral gate electrodes and the bit lines including the bit line contacts are made by forming a layer stack comprising at least one layer on the substrate surface so as to cover the memory cells and the peripheral circuitry, and, subsequently patterning the layer stack so as to form the bit lines and the peripheral gate electrodes.

11. The method of claim 10, wherein the patterning of the layer stack, so as to form the peripheral gate electrode and the bit lines including the bit line contacts, comprises an etching step of simultaneously etching the bit lines and the peripheral gate electrodes.

12. The method of claim 10, wherein the access transistors are provided by:
depositing a hardmask layer stack on the surface of the semiconductor substrate, the hardmask layer stack comprising at least one hardmask layer which is made of a material different from the semiconductor substrate, defining isolation trenches at suitable locations within the semiconductor substrate to laterally confine active areas in which the transistors are to be formed, respectively;
filling the isolation trenches with an isolating material that is different from the material of at least one hardmask layer of the hardmask layer stack;
defining gate grooves in the substrate surface; and
forming each of the word lines in a corresponding gate groove.

13. The method of claim 12, wherein each of the gate grooves has a bottom surface and two sidewalls, and the gate grooves are formed so that each bottom surface is rounded near an intersection between the bottom surface and any of the corresponding two sidewalls.

14. The method of claim 12, further comprising:
after forming the word line in a corresponding gate groove, filling an upper portion of the gate groove with an isolating material that is different from the material of at least one hard mask layer of the hardmask layer stack.

15. The method of claim 14, wherein the bit line contacts are defined photolithographically using a mask having a lines/spaces pattern so as to expose portions of the hardmask layer, and wherein the bitline contacts are etched by etching the exposed portions selectively with respect to the isolating material in the isolation trenches and in the gate grooves.

16. The method of claim 12, wherein, after defining the bit line contacts, the bit lines and the peripheral gate electrodes are formed, and wherein, after patterning the gate electrodes and the bit lines, a first spacer is formed at sidewalls of the bit lines and at sidewalls of the peripheral gate electrode, the spacer being made of an isolating material, and the method further comprises:
providing a second spacer of an isolating or semiconductor material at the sidewalls of the peripheral gate electrode.

17. The method according to claim 10, wherein the storage element comprises a capacitor comprising at least two storage electrodes that are disposed above the semiconductor surface, and at least one capacitor dielectric disposed between the two storage electrodes.

18. The method according to claim 17, wherein a contact between the storage element and the access transistor is provided by a capacitor contact formed above the semiconductor substrate, wherein the capacitor contact is defined photolithographically using a mask having a lines/spaces pattern.

* * * * *